United States Patent
Sugiyama et al.

(10) Patent No.: US 8,754,632 B2
(45) Date of Patent: Jun. 17, 2014

(54) INTEGRATED CIRCUIT WITH POWER STATE DETERMINATION CIRCUIT

(75) Inventors: Hidetoshi Sugiyama, Yokohama (JP);
Takayuki Nagasawa, Yokohama (JP);
Hideaki Suzuki, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 422 days.

(21) Appl. No.: 13/159,543

(22) Filed: Jun. 14, 2011

(65) Prior Publication Data

US 2012/0074926 A1    Mar. 29, 2012

(30) Foreign Application Priority Data

Sep. 24, 2010   (JP) ................. 2010-213170

(51) Int. Cl.
*G01R 19/00* (2006.01)
(52) U.S. Cl.
USPC .................................. 324/76.11
(58) Field of Classification Search
USPC ............ 324/76.11–76.25, 76.39–76.55, 600,
324/647–651, 500, 750.15, 750.3; 361/101,
361/6
See application file for complete search history.

(56) References Cited

U.S. PATENT DOCUMENTS

| | | | |
|---|---|---|---|
| 6,801,417 B2 | 10/2004 | Arai et al. | |
| 7,274,071 B2 | 9/2007 | Ando et al. | |
| 7,889,469 B2 | 2/2011 | Watanabe | |
| 7,952,371 B2* | 5/2011 | Nagasawa | 324/750.3 |
| 8,030,956 B2* | 10/2011 | Otsuga et al. | 324/750.3 |

FOREIGN PATENT DOCUMENTS

| | | |
|---|---|---|
| JP | 07-130960 | 5/1995 |
| JP | 2000-193709 A | 7/2000 |
| JP | 2002-259357 | 9/2002 |
| JP | 2003-31672 A | 1/2003 |
| JP | 2005-142261 | 6/2005 |
| JP | 2009-81307 A | 4/2009 |

OTHER PUBLICATIONS

JPOA—Office Action of Japanese Patent Application No. 2010-213170 dated Apr. 8, 2014, with English translation.

* cited by examiner

*Primary Examiner* — Melissa Koval
*Assistant Examiner* — Trung Nguyen
(74) *Attorney, Agent, or Firm* — Fujitsu Patent Center

(57) ABSTRACT

An integrated circuit in which a power terminal, a ground terminal, an input terminal and an internal circuit are formed, has a unidirectional circuit of a direction from the input terminal to the power terminal, the unidirectional circuit being provided between the input terminal and the power terminal; and a power state determination circuit which detects whether the power terminal is connected to an external power source or not to output a power open detection signal. And the unidirectional circuit includes a first transistor in which a voltage of the power terminal is applied to a gate, and a second transistor connected to the first transistor in series, and a voltage of the external power source is input to the input terminal.

16 Claims, 31 Drawing Sheets

FIG. 12

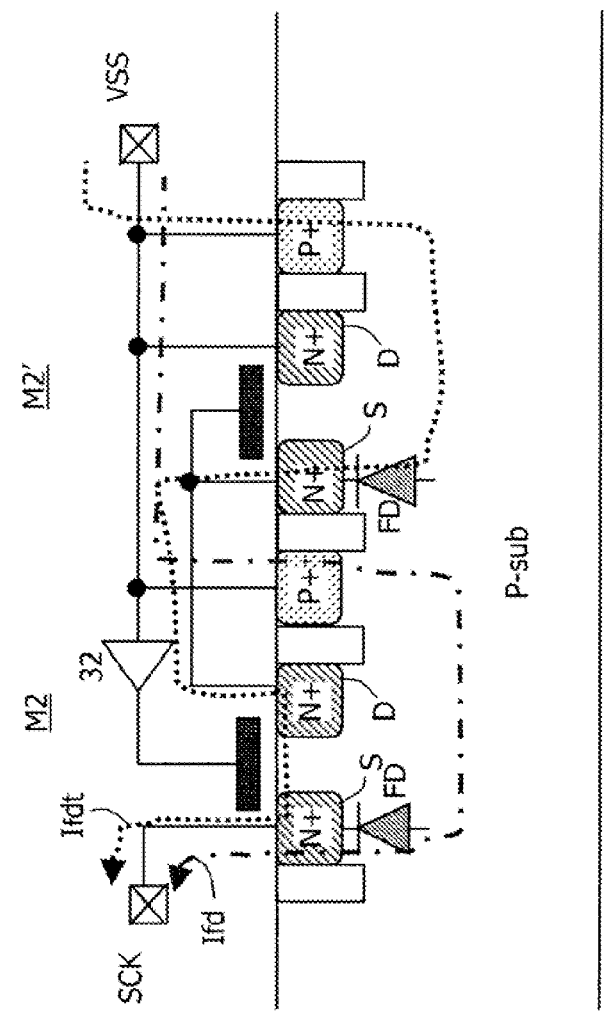
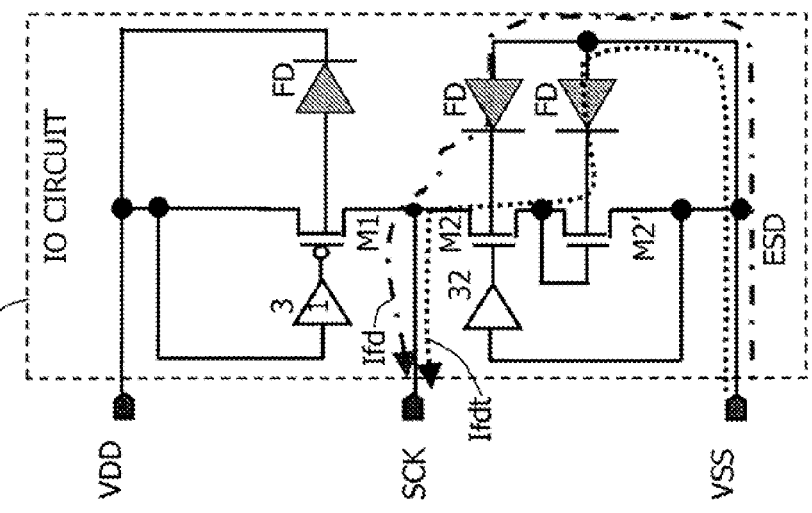
FIG. 25

INTEGRATED CIRCUIT WITH POWER STATE DETERMINATION CIRCUIT

CROSS-REFERENCE TO RELATED APPLICATIONS

This application is based upon and claims the benefit of priority of the prior Japanese Patent Application No. 2010-213170, filed on Sep. 24, 2010, the entire contents of which are incorporated herein by reference.

FIELD

The embodiment relates to an integrated circuit with a power state determination circuit.

BACKGROUND

An integrated circuit (LSI) has a power terminal, a ground terminal, an I/O signal terminal, and an internal circuit on a chip. The integrated circuit chip is housed in a package, and the package is connected to a circuit board. The power terminal, the ground terminal, and the signal terminal of the integrated circuit chip are connected to the corresponding terminals of the package, and additionally connected to the corresponding terminals of the circuit board. Accordingly, if there is a bad connection in the connection between the chip and the package or in the connection between the package and the circuit board, the power terminal and the ground terminal in the integrated circuit chip become an open state.

Even if the power terminal or the ground terminal in the chip is in an open state, it is subject to some type of voltage state via the internal circuit. Nevertheless, since such voltage state is not an appropriate state as a power supply or ground, the internal circuit is no longer able to operate properly. Accordingly, it is necessary to appropriately detect the open state of the power terminal and the ground terminal.

A circuit which detects an open state of a power terminal is described, for example, in Japanese Patent Application Laid-open No. 2000-193709. In addition, Japanese Patent Application Laid-open No. 2009-81307 and Japanese Patent Application Laid-open No. 2003-31672 describe an I/O circuit connected to an I/O terminal.

Since the power terminal or ground terminal of the chip is subject to some kind of voltage state via the internal circuit even if it is in an open state, the open state can be detected by detecting the voltage state thereof. However, if the detection margin is small, there are cases where the open state is erroneously detected when the voltage of the input terminal exceeds the potential of the power terminal or falls below the potential of the ground terminal in a normal connection status.

SUMMARY

Thus, an object of this invention is to provide an integrated circuit with a power state determination circuit with an increased operation margin.

According to an aspect of the embodiment, a integrated circuit in which a power terminal, a ground terminal, an input terminal and an internal circuit are formed, has a unidirectional circuit of a direction from the input terminal to the power terminal, the unidirectional circuit being provided between the input terminal and the power terminal; and a power state determination circuit which detects whether the power terminal is connected to an external power source or not to output a power open detection signal. And the unidirectional circuit includes a first transistor in which a voltage of the power terminal is applied to a gate, and a second transistor connected to the first transistor in series, and a voltage of the external power source is input to the input terminal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 12 is a diagram depicting the circuit and chip cross section of the second example of the IO circuit of the integrated circuit according to the first embodiment.

FIG. 25 is a diagram depicting the first example of the IO circuit of the integrated circuit according to the second embodiment and the cross section on its chip.

DESCRIPTION OF EMBODIMENTS

First Embodiment

Figure 1:
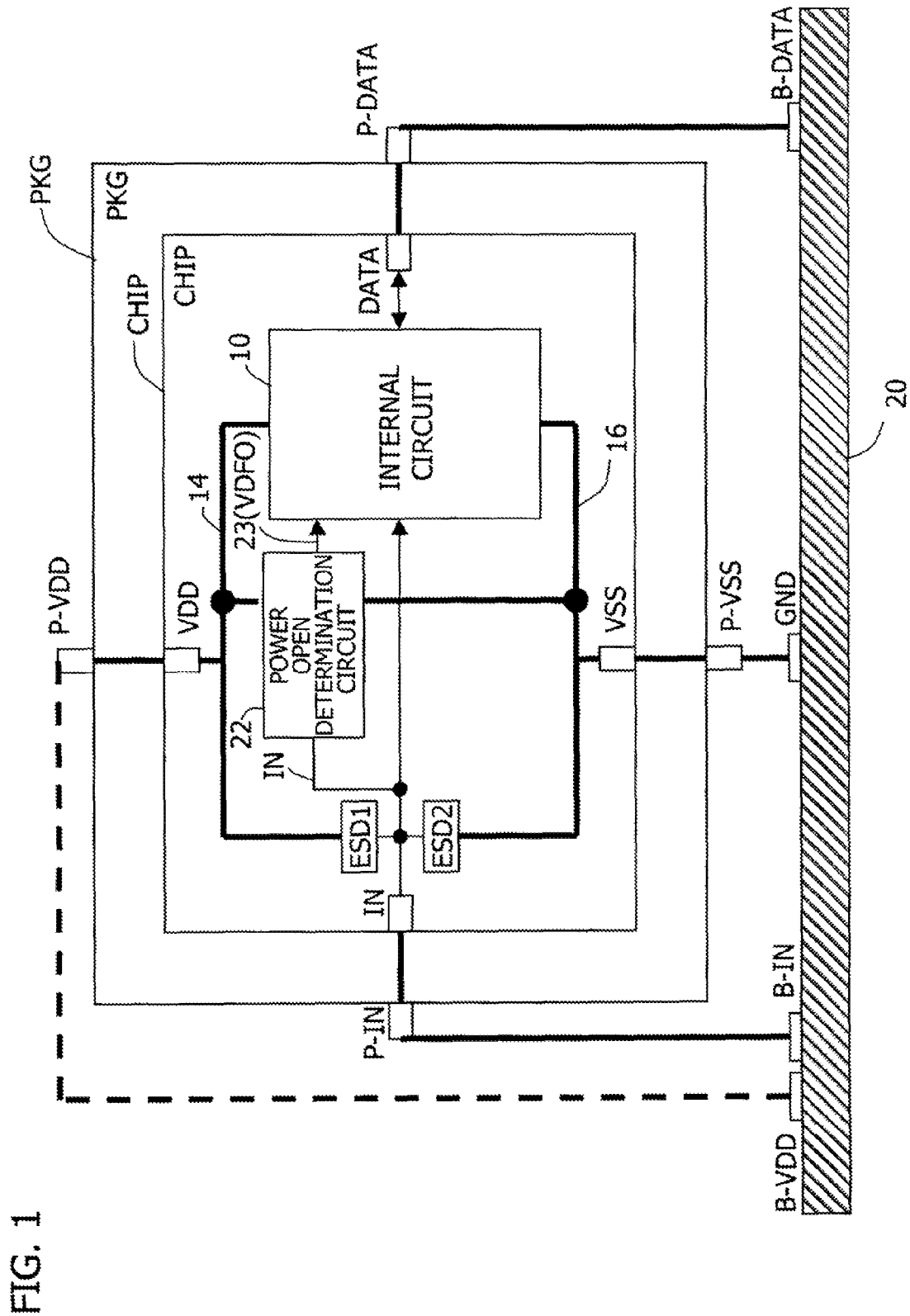
FIG. 1 is a configuration diagram of the integrated circuit device according to the first embodiment.

FIG. 1 is a configuration diagram of the integrated circuit device according to the first embodiment. The integrated circuit device includes a chip CHIP in which an integrated circuit is formed thereon, and a package PKG which houses the chip CHIP. The chip CHIP corresponds to an integrated circuit (IC) in this specification. The integrated circuit CHIP is provided with a power terminal VDD, a ground terminal VSS, an input terminal IN, and a data I/O terminal DATA. The power terminal VDD is connected to a power wiring 14, and the ground terminal VSS is connected to a ground wiring 16. The internal circuit 10 inputs or outputs data to or from the data I/O terminal DATA based on an input signal that is input to the input terminal IN.

The respective terminals VDD, VSS, IN, DATA in the integrated circuit CHIP are respectively connected to the external terminals P-VDD, P-VSS, P-IN, P-DATA of the package PKG. In addition, the external terminals P-VDD, P-VSS, P-IN, P-DATA of the package PKG are respectively connected to the terminals B-VDD, GND, B-IN, B-DATA of an external circuit board 20.

Moreover, the chip CHIP is internally provided with a unidirectional circuit between the input terminal IN and the power terminal VDD which causes a current to flow only in the direction from the input terminal to the power terminal; for example, an electrostatic breakdown protection element ESD1 configured from a diode, and a unidirectional circuit provided between the input terminal IN and the ground terminal VSS which causes a current to flow only in the direction from the ground terminal to the input terminal; for example, an electrostatic breakdown protection element ESD2 configured from a diode. Although not depicted, the electrostatic breakdown protection elements ESD1, ESD2 are similarly provided between the data I/O terminal DATA and the power terminal VDD or the ground terminal VSS.

In the first embodiment, the integrated circuit CHIP includes a power open determination circuit (power state determination circuit) 22, and the power open determination circuit 22 detects an open state where the power terminal VDD on the chip is not electrically connected to the external power terminal B-VDD. The power open determination circuit 22 is provided between the power wiring 14 and the ground wiring 16, and detects a voltage drop of the power terminal VDD when the power terminal VDD becomes an open state for some reason. The power open determination circuit 22 outputs a power open detection signal 23 (VDFO) depicting that the power supply is open when the voltage of the power terminal VDD becomes open.

When the power open detection signal 23 depicting that the power supply has opened is output, the internal circuit 10 suspends its operation, resets itself, causes access to a memory in the internal circuit to wait, shifts to the power shutdown operation, or notifies the drop in the power supply voltage to the external host computer. In other words, since the power supply voltage is not in a normal state, some kind of control is performed so that the internal circuit 10 does not malfunction.

In the electrostatic breakdown protection elements ESD1, ESD2, if static of a high positive electric potential is input to the input terminal IN, the electrostatic breakdown protection element ESD1 is conducted to release the electric charge of the static in a direction from the input terminal IN to the power terminal VDD. Meanwhile, if static of a low negative electric potential is input to the input terminal IN, the electrostatic breakdown protection element ESD2 is conducted to release the electric charge of the static in a direction from the ground terminal VSS to the input terminal IN.

However, the electrostatic breakdown protection elements ESD1, ESD2 are unidirectional elements which only cause the current to flow in one direction. Accordingly, in a normal operation state where normal power supply voltage is applied to the power terminal VDD, normal ground potential is applied to the ground terminal VSS, and a normal signal between the power supply voltage and the ground is input to the input terminal IN, neither of the electrostatic breakdown protection elements ESD1, ESD2 are conducted.

When the power terminal VDD becomes an open state, the potential of the power wiring 14 will drop due to the circuit in the power open determination circuit 22, and the potential of the input terminal IN of an H-level state becomes higher than the potential of the power terminal VDD. The H-level of the input terminal IN is equal to the potential of the external power source B-VDD. Consequently, the electrostatic breakdown protection element ESD1 is conducted and the potential of the power wiring 14 becomes lower, in the amount of the voltage drop of the electrostatic breakdown protection element, than the potential of the input terminal IN of an H-level state. The power open determination circuit 22 detects this kind of potential drop of the power terminal VDD in the open state of the power terminal VDD.

The premise is that, in a normal operation state, an H-level signal with a potential of the external power source B-VDD is supplied to the input terminal IN. As the input terminal IN, preferably used is a reset signal terminal which becomes, for example, an L-level of the reset level when the power is turned on, and becomes an H-level in which the reset was cancelled in the normal operation state. Otherwise, the input terminal IN may be a clock signal which intermittently becomes an H-level in the normal operation state, or other control signals.

Cases of a VDD open state where the power terminal VDD in the chip is not electrically connected to the external power terminal B-VDD may occur, for example, when there is a bad solder connection between the power terminal B-VDD of the circuit board 20 and the power terminal P-VDD of the package PKG, or when there is a bad connection between the power terminal P-VDD of the package PKG and the power terminal VDD of the chip.

In the explanation of the embodiments, an open state of the power terminal VDD is taken as an example of a state where the potential of the power terminal VDD has dropped.

Figure 2:
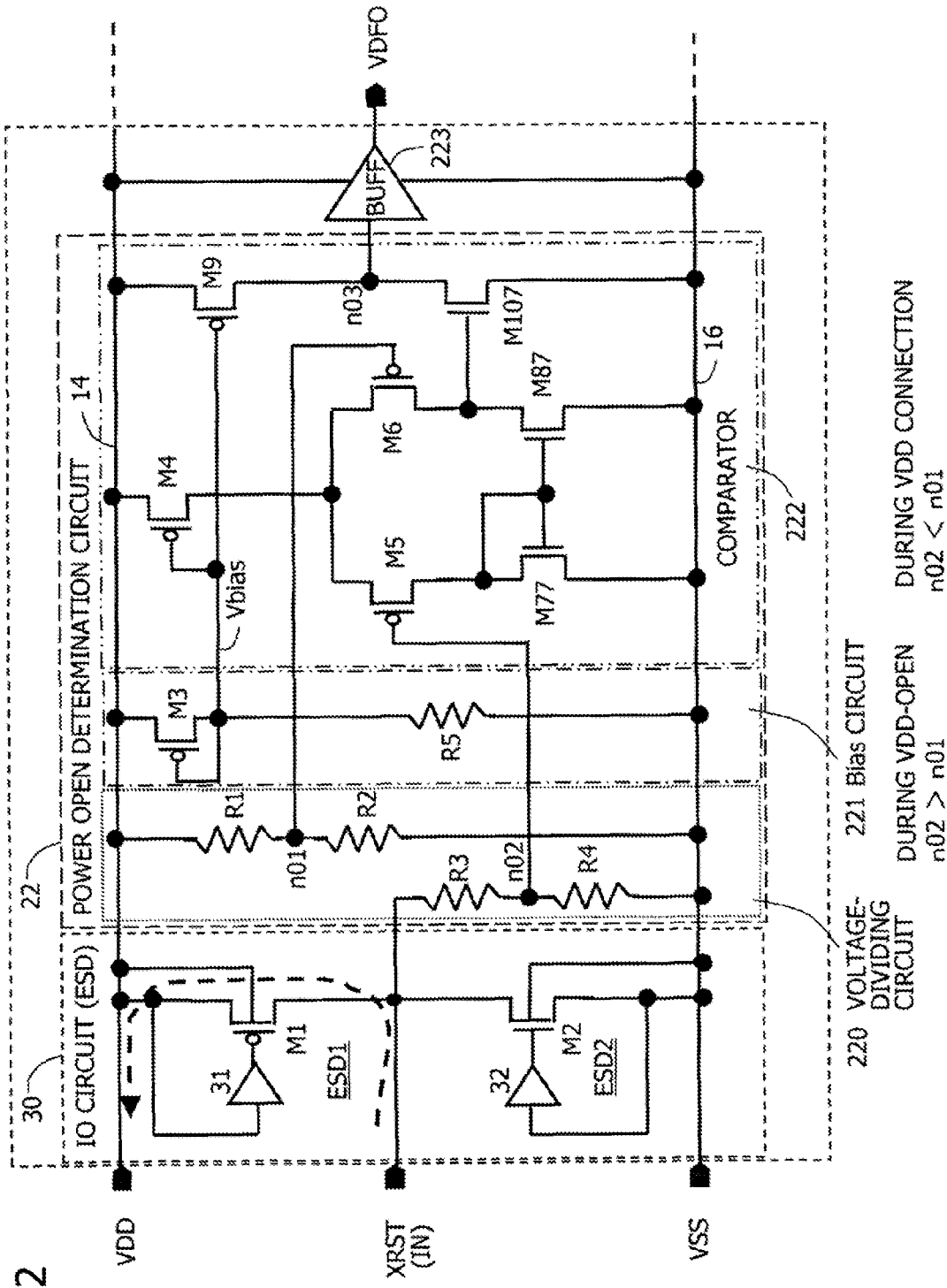
FIG. 2 is a circuit diagram of the power open detection circuit according to this embodiment.

FIG. 2 is a circuit diagram of the power open detection circuit according to this embodiment. An IO circuit 30 of the input terminal IN is provided with a P-channel MOS transistor M1 and a soft clip buffer 31 as the electrostatic breakdown protection element ESD1, and an N-channel MOS transistor M2 and a soft clip buffer 32 as the electrostatic breakdown protection element ESD2 between the input terminal IN, and the power terminal VDD and the ground terminal VSS, respectively. The input terminal IN is a reset terminal XRST in this example, and becomes an L-level in a reset state and becomes an H-level in a normal state. If an excessively high potential is applied to the input terminal IN, the transistor M1 is conducted and current flows in the direction depicted with a broken line so as to prevent a high voltage from being applied to the internal circuit. Contrarily, if a potential that is lower than the ground is applied to the input terminal IN, the transistor M2 is conducted and current flows in the direction from the ground terminal VSS to the input terminal IN so as to prevent a low voltage from being applied to the internal circuit.

The power open determination circuit 22 includes a voltage-dividing circuit 220 having resistors R1, R2 which divide the voltage of the power source VDD and resistors R3, R4 which divide the voltage of the input terminal IN, a bias circuit 221 configured from a transistor M3 and a resistor R5 and which generates a bias voltage Vbias, a comparator 222 which compares the divided voltages of nodes n01, n02, and a buffer 223 which buffers a comparator output n03 and outputs a power open detection signal VDFO.

The comparator 222 includes P-channel transistors M5, M6 in which the divided voltages of the nodes n01, n02 are respectively applied to a gate, a P-channel transistor M4 in which the bias voltage Vbias is applied to a gate and which generates a constant current, N-channel transistors M77, M87 which configure a current mirror circuit, an N-channel transistor M107 in which a drain of the transistor M6 is connected to a gate, and a P-channel transistor M9 in which the bias voltage Vbias is applied to a gate. The transistors M5, M6 compare the divided voltages that are applied to the gate, and, based on the comparison result, the output node n03 becomes an H-level if n01>n02, and the output node n03 becomes an L-level if n01<n02. Moreover, the resistors R1, R2, R3, R4 are set, for example, such that R2=R4, R1<R3.

In FIG. 2, the reset signal XRST of the input terminal IN is of an H-level of the potential of the external power source B-VDD in a normal operation state. In addition, if the power terminal VDD is normally connected to the external power source B-VDD, the power terminal VDD and the input terminal IN become the potential of the same external power source B-VDD. In the foregoing case, since R2=R4, R1<R3, the divided voltages of the nodes n01, n02 will be n01>n02, and the comparator 222 sets the output node n03 to an H-level.

Meanwhile, if the power terminal VDD becomes an open state, the potential of the power wiring 14 connected to the power terminal VDD will drop via the resistors R1, R2 of the voltage-dividing circuit 220. The buffer 31 is configured, for example, from a 2-stage CMOS inverter, and the voltage of the power terminal VDD is applied to the gate of the transistor M1. Meanwhile, the reset signal XRST of the input terminal IN is of an H-level of the potential of the external power source B-VDD. Thus, pursuant to the potential drop of the power wiring 14, the current depicted with the broken line flows to the transistor M1. Consequently, the potential of the power terminal VDD becomes lower than the B-VDD voltage of the reset terminal XRST in the amount of a threshold voltage PMOSVth of the transistor M1.

The resistance values of the resistors R1 to R4 are set so that the divided voltages of the nodes n01, n02 become n01<n02 based on the potential drop of the power terminal VDD. Consequently, the comparator 222 sets the output node n03 to an L-level.

Figure 3:
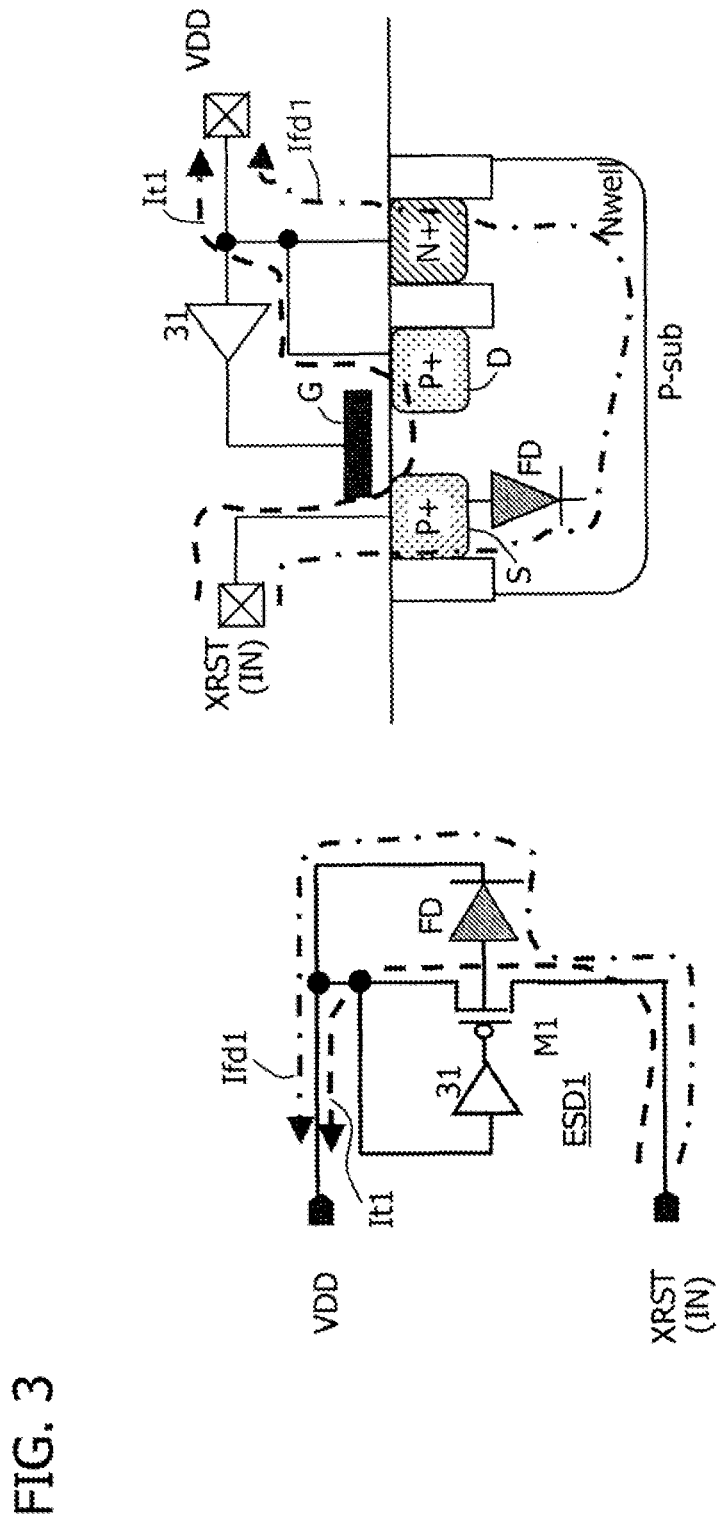
FIG. 3 is a diagram depicting the circuit of the electrostatic breakdown protection element ESD1 of FIG. 2 and a chip cross section.

FIG. 3 is a diagram depicting the circuit of the electrostatic breakdown protection element ESD1 of FIG. 2 and a chip cross section. The P-channel MOS transistor M1 includes a P-type source region S, a drain region D in an N-type well region Nwell within a P-type substrate P-sub and a gate electrode G therebetween. Between the input terminal IN and the power terminal VDD, as depicted in the circuit diagram and the cross section diagram, there are a current path It1 that passes through the source and drain region of the transistor M1, and a current path Ifd1 that passes through a field diode FD configured from a PN junction between the P-type source region S connected to the input terminal IN (XRST) and the N-type well region Nwell, and through the N-type well region Nwell. However, whereas the current path It1 only has a voltage drop of the threshold voltage PMOSVth of the P-channel transistor M1, the current path Ifd1 has a voltage drop of the threshold voltage FDVth of the field diode, and, since it is FDVth>PMOSVth, the current path It1 becomes dominant. Here, let it be assumed that FDVth≅2PMOSVth.

Consequently, when the power terminal VDD is in an open state, the potential of the power terminal VDD will drop as follows.

$$VDD = XRST - PMOSVth$$

Here, XRST is the voltage of the input terminal IN and is the same potential as the external power source B-VDD.

Figure 4:
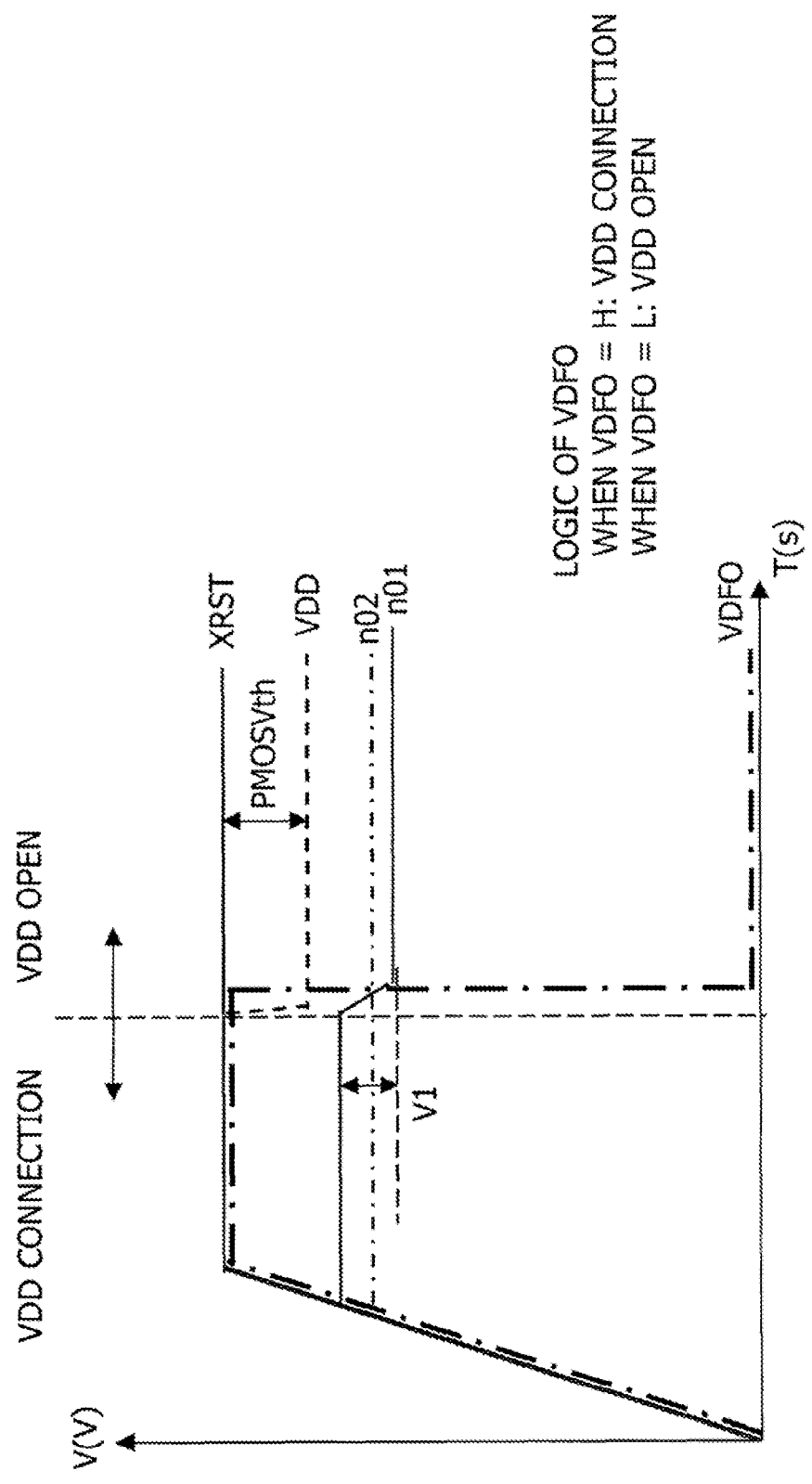
FIG. 4 is a diagram explaining the operation of the power open detection circuit of FIG. 2.

FIG. 4 is a diagram explaining the operation of the power open detection circuit of FIG. 2. In FIG. 4, the left side depicts a state where the power terminal VDD is connected normally, and the right side depicts an open state of the power terminal VDD, respectively. When the external power source B-VDD rises, the power terminal VDD and the reset terminal XRST as the input terminal also rise with the same potential. Here, in a state where the power terminal VDD is connected normally, as described above, the relation of the divided voltages of the nodes n01, n02 is n01>n02. Consequently, the power open detection signal VDFO becomes an H-level (normal potential state).

Meanwhile, when the power terminal VDD is an open state, based on the conduction of the electrostatic breakdown protection element ESD1, the power terminal VDD drops to XRST−PMOSVth. Consequently, the relation of the divided voltages of the nodes n01, n02 will become n01<n02. Consequently, the power open detection signal VDFO becomes an L-level (VDD open state or power drop state).

Figure 5:
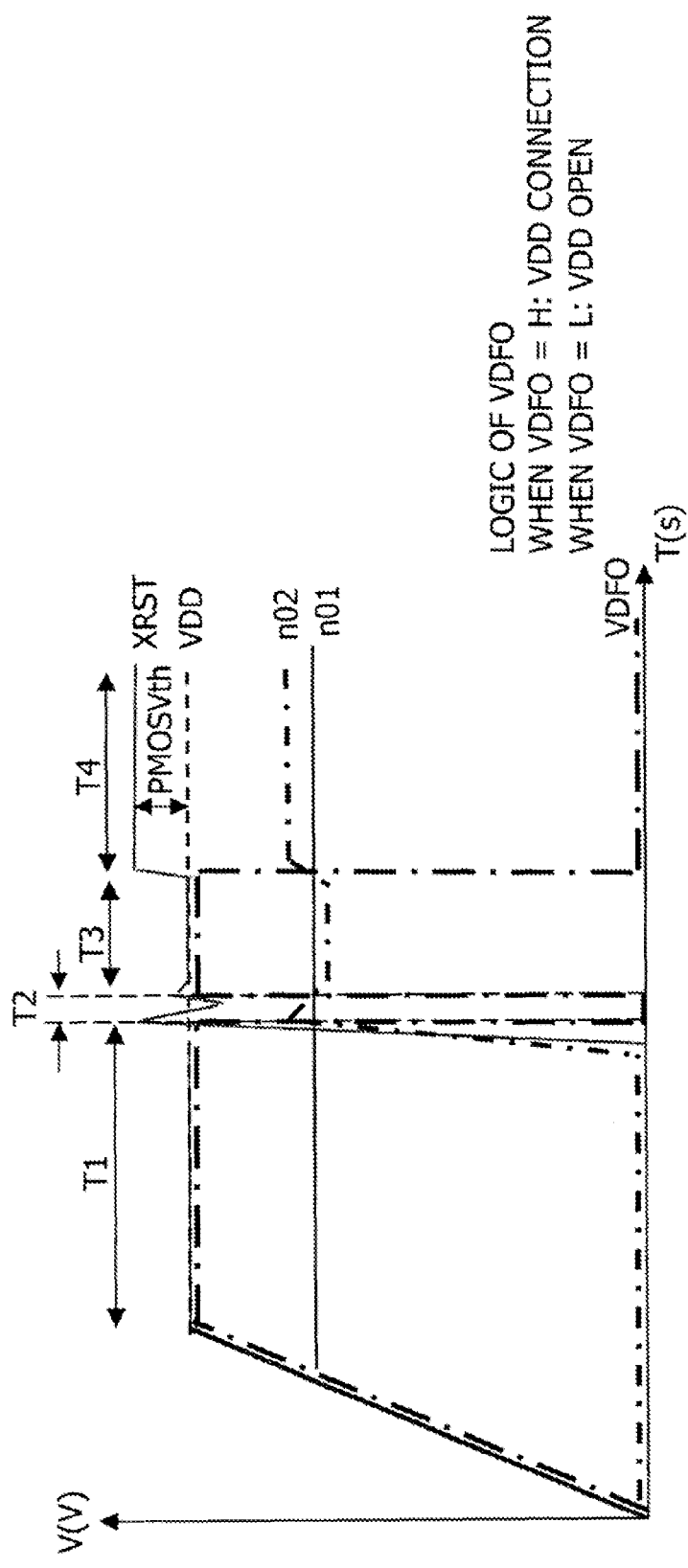
FIG. 5 is a diagram explaining the operation of the power open detection circuit of FIG. 2.

FIG. 5 is a diagram explaining the operation of the power open detection circuit of FIG. 2. FIG. 5 depicts a case T2 of an overshoot voltage being applied when the reset terminal XRST as the input terminal rises in a state where the power terminal VDD is connected normally, and a case T4 of becoming a higher potential than the power source VDD for some reason.

In FIG. 4, when the power terminal VDD is connected normally, the operation margin V1 between the nodes n01, n02 in a relation of n01>n02 is not that large. The reason for this is because it is necessary to set the resistors R1, R2, R3, R4 to become n01<n02 when the power terminal VDD drops.

After the power boot time T1, in the normal operation state T3 after the reset signal XRST has risen from the L-level to the H-level, it is n01>n02 and the power open detection signal VDFO is at an H-level (normal potential state). Nevertheless, in the case T2 where an overshoot voltage is applied when the reset terminal XRST as the input terminal rises, the potential of the node n02 obtained by dividing the reset terminal XRST is rising higher than the node n01. Similarly, even in the case T4 where the reset terminal XRST is of a higher potential than the power source VDD, the potential of the node n02 is rising higher than the node n01. In the states T2, T4, the potential of the reset terminal XRST is as follows.

$$XRST > VDD + PMOSVth$$

Specifically, a voltage difference that is substantially the same as the VDD open state is generated between the reset terminal XRST and the power terminal VDD, and the power open determination circuit 22 sets the power open detection signal VDFO to an L-level (VDD open state or power drop state), and is erroneously detecting the VDD open state.

As described above, as a result of the operation margin of the power open determination circuit being small, the VDD open state or the power supply voltage drop state is erroneously detected even though the power terminal VDD is connected normally or even if it is of a normal potential. There are demands for avoiding this kind of false detection.

Figure 6:
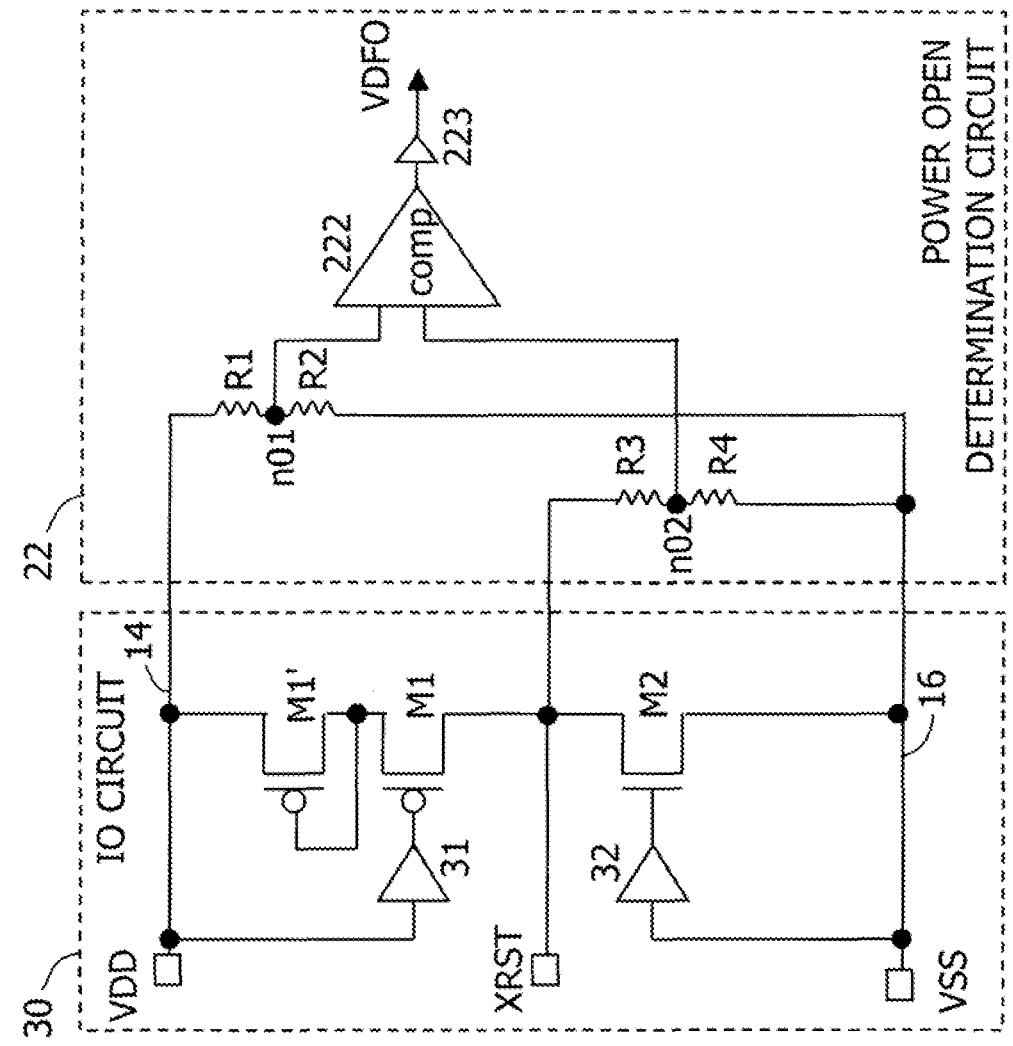
FIG. 6 is a circuit diagram of the integrated circuit according to the first embodiment.

FIG. 6 is a circuit diagram of the integrated circuit according to the first embodiment. This integrated circuit includes a power terminal VDD, a ground terminal VSS, an input terminal XRST, and an internal circuit not depicted. In addition, the IO circuit 30 is provided with unidirectional circuits M1, M1' of a direction from the input terminal to the power terminal and which are provided between the input terminal XRST and the power terminal VDD, and a unidirectional circuit M2 of a direction from the ground terminal VSS to the input terminal. In addition, the integrated circuit includes a power open determination circuit 22 which detects whether the power terminal VDD is connected or open and outputs a power open detection signal VDFO. Moreover, a voltage of the external power source B-VDD is input to the input terminal XRST.

The unidirectional circuit between the reset terminal XRST and the power terminal VDD in the IO circuit 30 includes a first transistor M1 in which a voltage of the power terminal VDD is applied to a gate, and a second transistor M1' connected to the first transistor M1 in series. The second transistor M1' is connected between the first transistor M1 and the power terminal VDD, and its gate is connected to a drain terminal of the first transistor M1. In addition, the power terminal VDD is connected to the gate of the first transistor M1 via a buffer 31. Specifically, since the buffer 31 is configured from a 2-stage CMOS inverter, so as long as the power terminal VDD is of an H-level, the voltage of the power wiring 14 that leads to the power terminal VDD is applied to the gate of the first transistor M1. Moreover, the unidirectional circuit between the reset terminal XRST and the ground terminal VSS includes an N-channel MOS transistor M2 and a buffer 32 as with FIG. 2.

The power open determination circuit 22 includes, as with the configuration depicted in FIG. 2, a comparator 222 which compares the voltage of the node n01 obtained by dividing the VDD-to-VSS voltage with the resistors R1, R2 and the voltage of the node n02 obtained by dividing the resistor XRST-to-VSS voltage with the resistors R3, R4, and a buffer 223. These are the same circuits as the power open determination circuit 22 depicted in FIG. 2.

Figure 7:
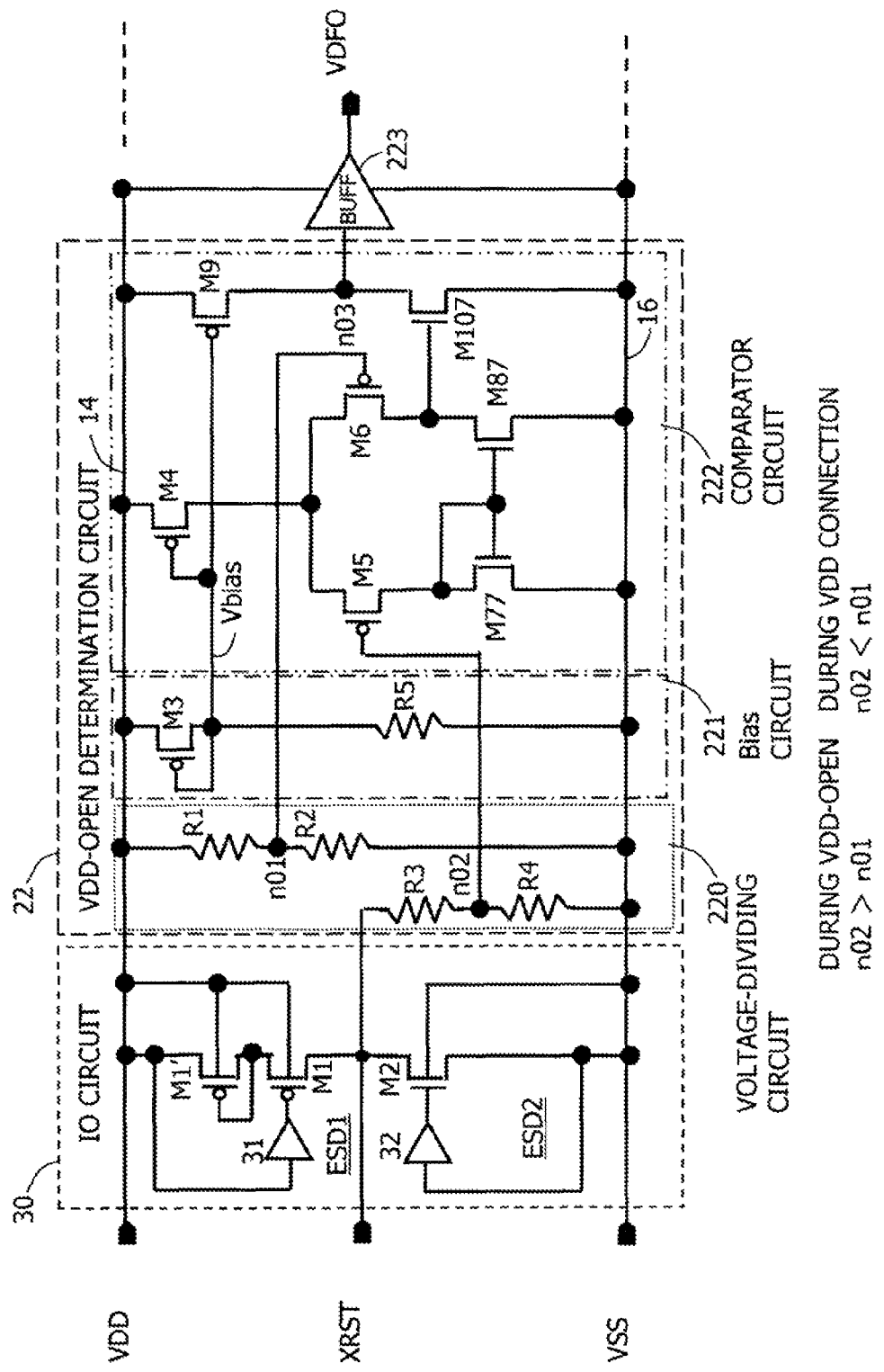
FIG. 7 is a circuit diagram of the integrated circuit according to the first embodiment.

FIG. 7 is a circuit diagram of the integrated circuit according to the first embodiment. The IO circuit 30 of FIG. 7 is configured the same as the IO circuit 30 of FIG. 6. Moreover, the circuit of the power open determination circuit 22 of FIG. 7 is the same as the power open determination circuit 22 of FIG. 6 that was explained in detail, and is configured the same as the configuration depicted in FIG. 2.

Figure 8:
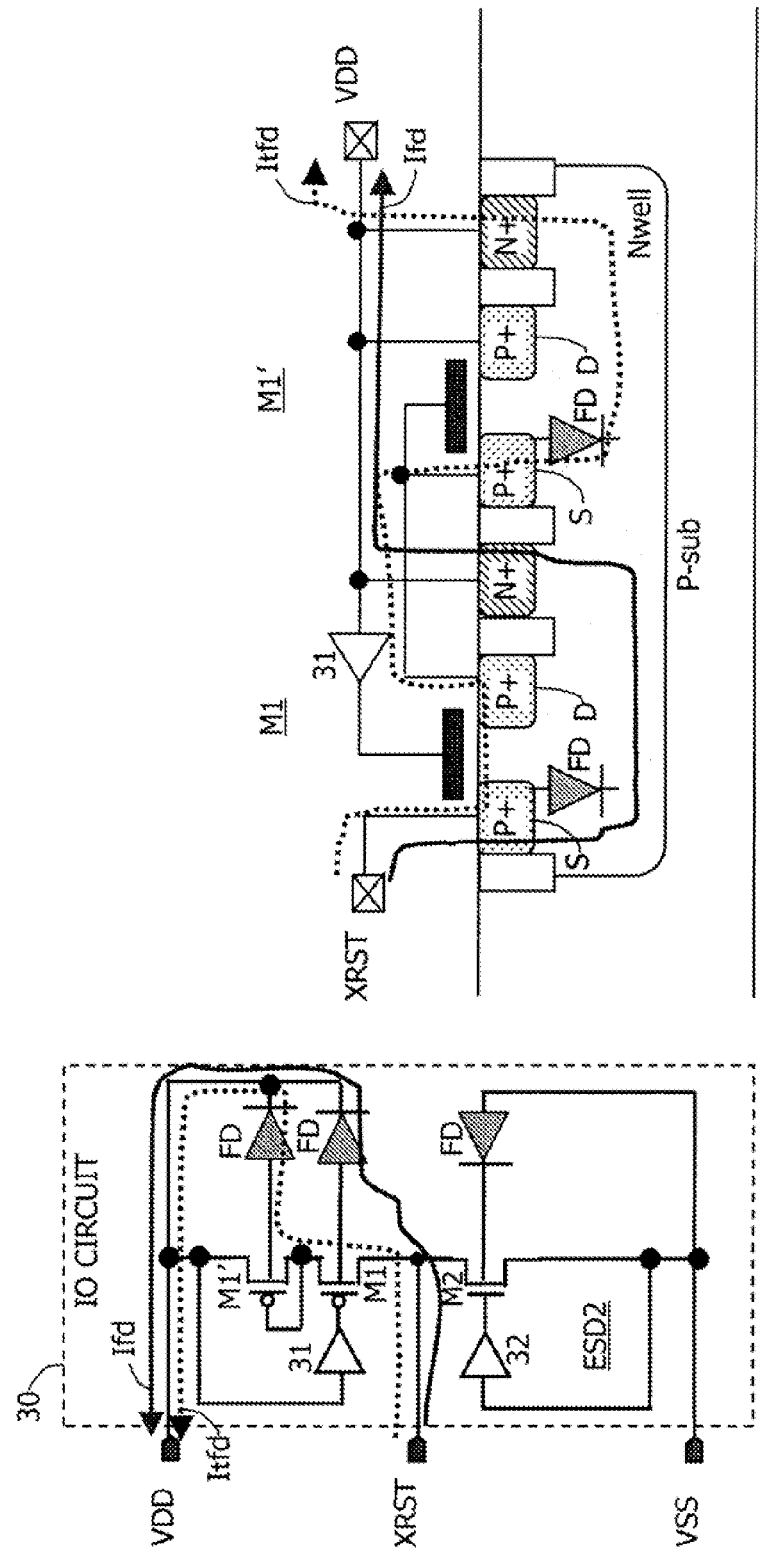
FIG. 8 is a diagram depicting a detailed circuit of the IO circuit (first example) of FIG. 6 and FIG. 7 and a chip cross section.

FIG. 8 is a diagram depicting a detailed circuit of the IO circuit (first example) of FIG. 6 and FIG. 7 and a chip cross section. With the unidirectional circuit between the reset terminal XRST and the power terminal VDD in this example, the first and second transistors M1, M1' are P-channel MOS transistors, and the second transistor M1' is provided between the first transistor M1 and the power terminal VDD, and its gate is connected to a drain terminal of the first transistor M1. Moreover, as evident from the cross section diagram, the first and second transistors M1, M1' have the same P-type source and drain region S, D in the same N-type well region Nwell. The N-type well region Nwell is connected to the power terminal VDD via an N-type contact region, and supplied with a back gate bias. Thus, a parasitic field diode FD is formed at the PN junction between the source region S and the N-type well region Nwell of the first and second transistors M1, M1'. In other words, when compared with the IO circuit of FIG. 2, the unidirectional circuit of the IO circuit of FIG. 7 has a configuration where the second transistor M1' is added to the first transistor M1.

With the IO circuit 30, when the power terminal VDD becomes an open state and its potential drops, the voltage between the gate and source of the first transistor M1 exceeds the threshold voltage PMOSVth, and the transistor M1 is conducted. Nevertheless, the second transistor M1' is constantly in a non-conducted state since the gate and source are connected. Accordingly, as the current paths from the input terminal XRST to the power terminal VDD, as depicted with the solid line, there is a current path Ifd which only passes through the field diode FD of the first transistor M1, and, as depicted with the broken line, there is a current path Itfd that passes through between the source and drain of the first transistor M1 and the field diode FD of the second transistor M1'. Nevertheless, the voltage drops of the current paths Ifd, Itfd are respectively FDVth, PMOSVth+FDVth, and the current path Ifd with a small voltage drop becomes dominant.

Accordingly, with this IO circuit 30, the potential of the power terminal VDD in an open state becomes as follows.

$$VDD = XRST - FDVth$$

Meanwhile, the potential of the power terminal VDD in an open state in the IO circuit of FIG. 2 is as follows.

$$VDD = XRST - PMOSVth$$

In other words, since FDVth≅2PMOSVth, the potential of the power source VDD when the power terminal VDD is in an open state is lower in the IO circuit of FIG. 8.

Figure 9:
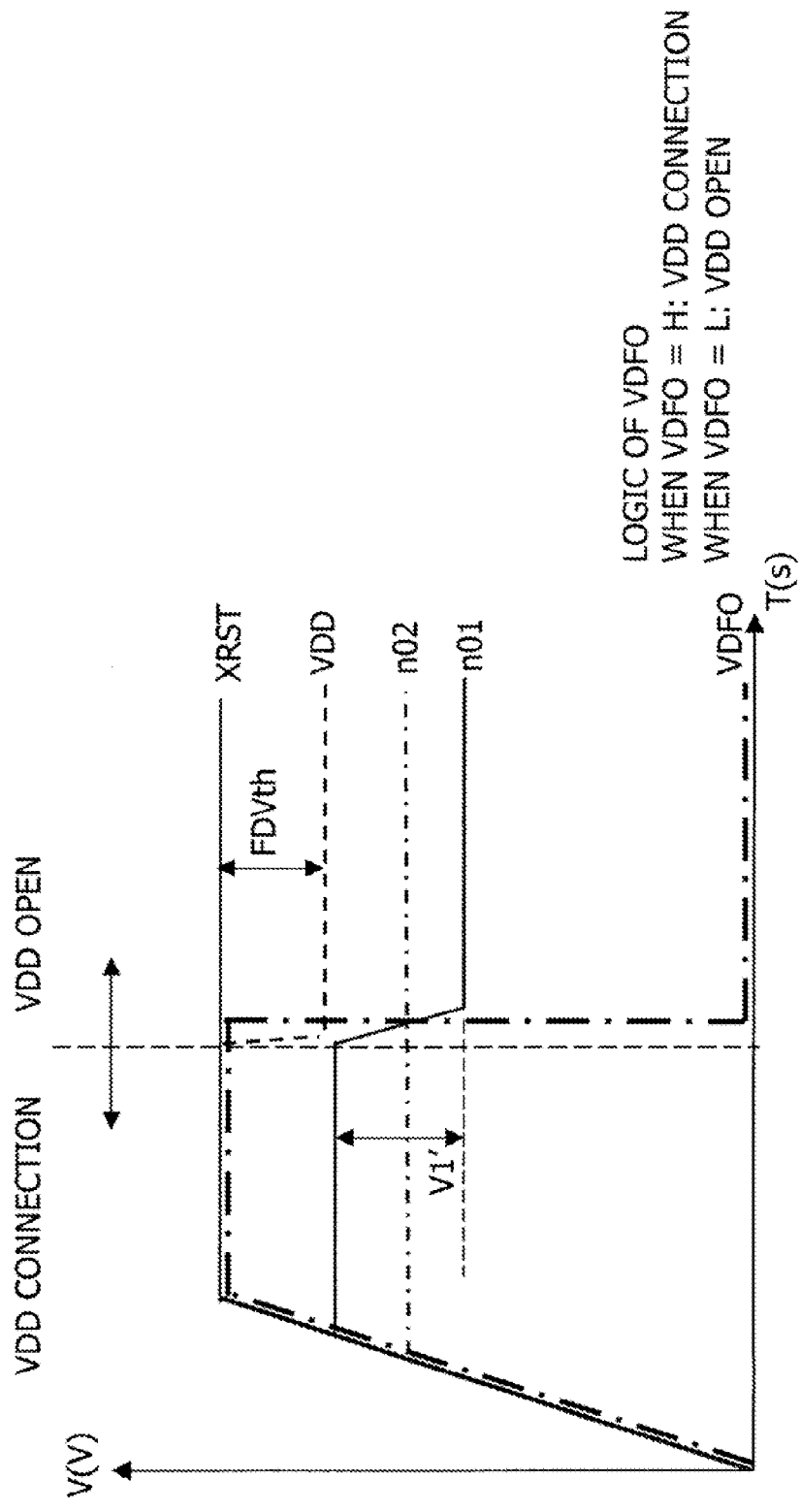
FIG. 9 is a diagram explaining the operation of the power open detection circuit of FIGS. 6, 7, and 8.

FIG. 9 is a diagram explaining the operation of the power open detection circuit of FIGS. 6, 7, and 8. As evident when compared with FIG. 4, when the power terminal VDD becomes an open state, the voltage of the power terminal VDD drops considerably to XRST−FDVth. The potential of the node n01 consequently drops considerably. Specifically, the voltage fluctuation V1' of the node n01 is a voltage corresponding to FDVth, and is greater than the voltage corresponding to PMOSVth of the voltage fluctuation V1 of FIG. 4. It is therefore possible to lower the voltage-dividing level of the node n02 that is decided by the resistors R3, R4 than the case depicted in FIG. 4. Otherwise, it is possible to raise the voltage-dividing level of the node n01 that is decided by the resistors R1, R2 than the case depicted in FIG. 4. Consequently, in a state where the power terminal VDD is connected, the voltage difference between the nodes n01, n02; that is, the operation margin can be increased.

Figure 10:
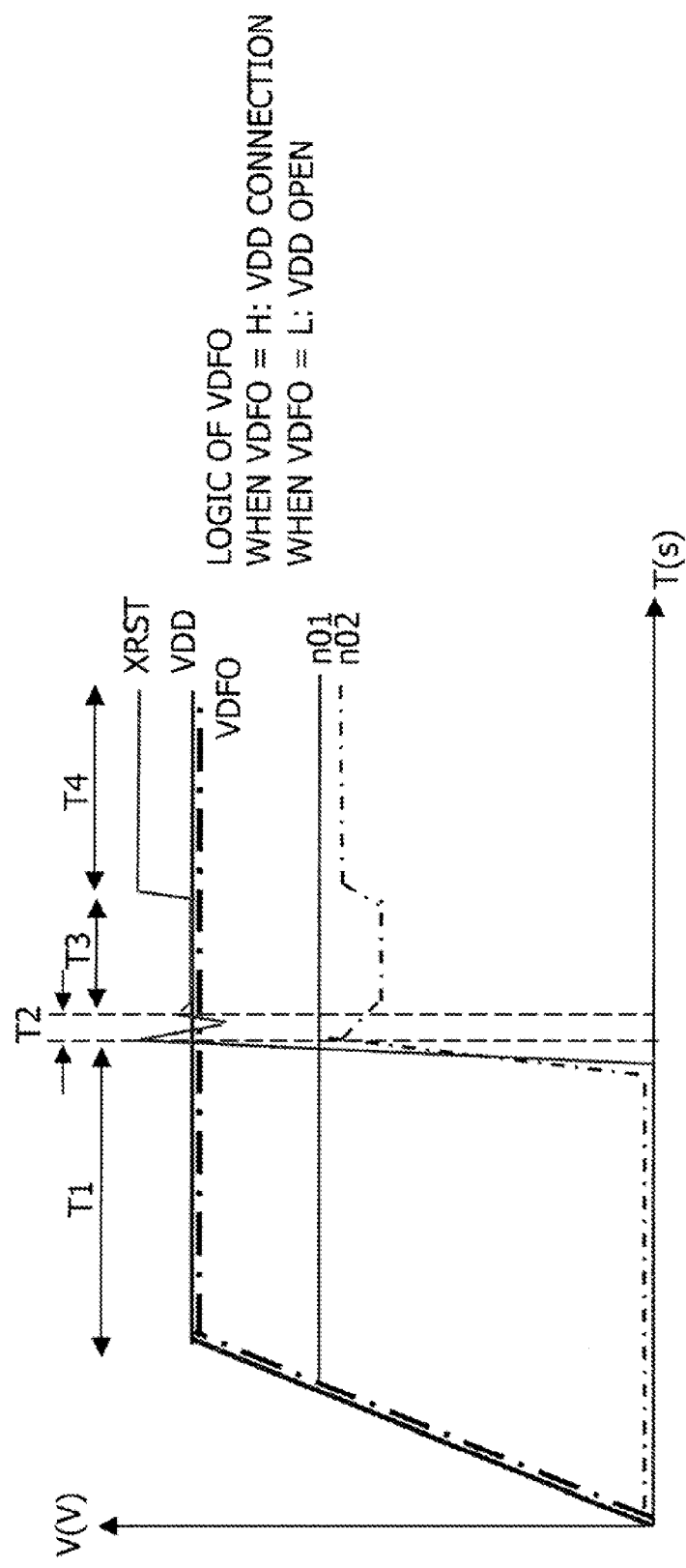
FIG. 10 is a diagram explaining the operation of the power open detection circuit of FIGS. 6, 7, and 8.

FIG. 10 is a diagram explaining the operation of the power open detection circuit of FIGS. 6, 7, and 8. In this example, as a result of being able to further lower the potential of the node n02, and further raise the potential of the node n01, it is possible to maintain the potential relation of the nodes n01, n02 to be n01>n02 at the overshoot state T2 upon causing the input terminal XRST to rise from the L-level to the H-level, and in the case T4 where the H-level of the input terminal XRST becomes higher than the potential of the power source VDD for some reason. Specifically, with the integrated circuit of FIGS. 7 and 8, the erroneous detection of the power terminal open state can be inhibited in the overshoot case T2 and the case T4 where the input terminal XRST rises.

Figure 11:
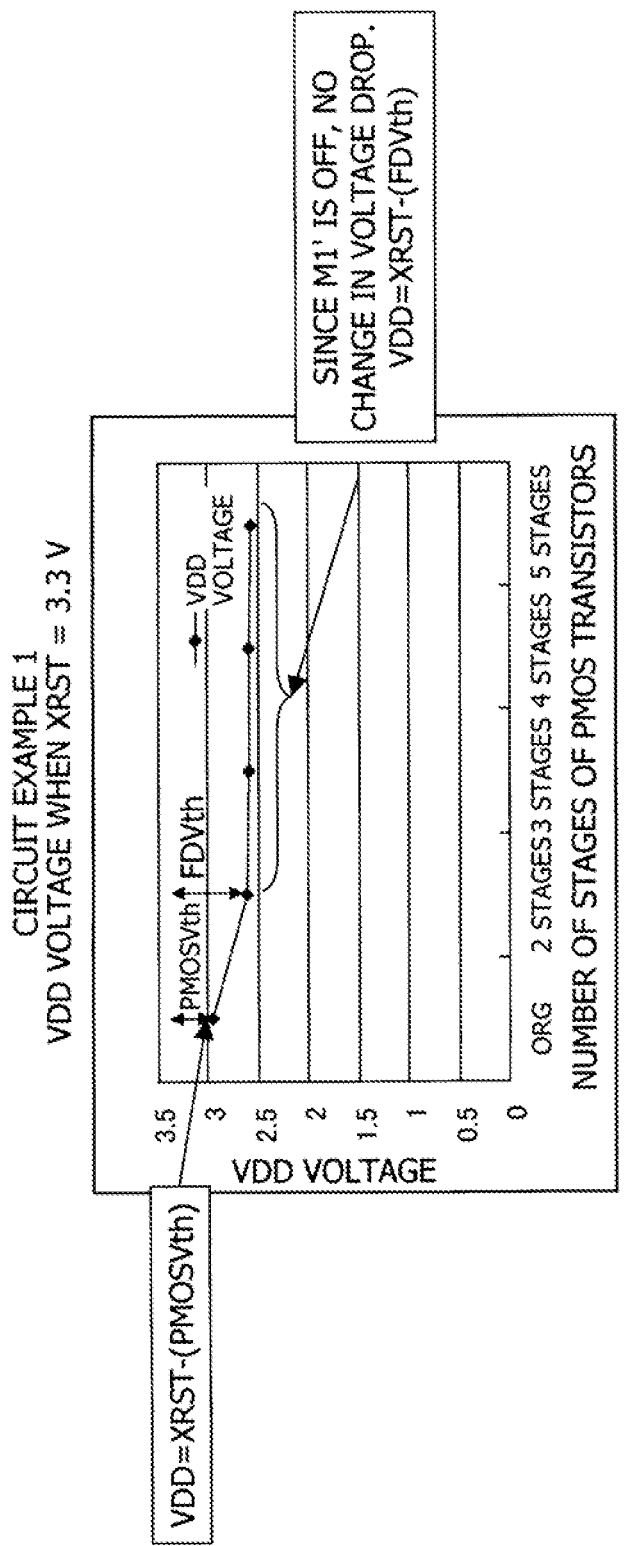
FIG. 11 is a diagram depicting the voltage of the power terminal VDD in a VDD open state where the second transistor M1' of the IO circuit of FIGS. 6, 7, and 8 is increased.

FIG. 11 is a diagram depicting the voltage of the power terminal VDD in a VDD open state where the second transistor M1' of the IO circuit of FIGS. 6, 7, and 8 is increased. The horizontal axis depicts the IO circuit (ORG) of FIG. 2 and the number of P-channel transistors M1, M1' in the unidirectional circuit, and the vertical axis depicts the voltage of the power source VDD. In the case of FIG. 2, the voltage of the power terminal VDD is as follows.

VDD=XRST−PMOSVth

Meanwhile, if the second transistor M1' is further added to the P-channel transistors M1, M1', since the second transistor M1' becomes an OFF state, the voltage of the power terminal VDD becomes constant as follows.

VDD=XRST−FDVth

Figure 12:
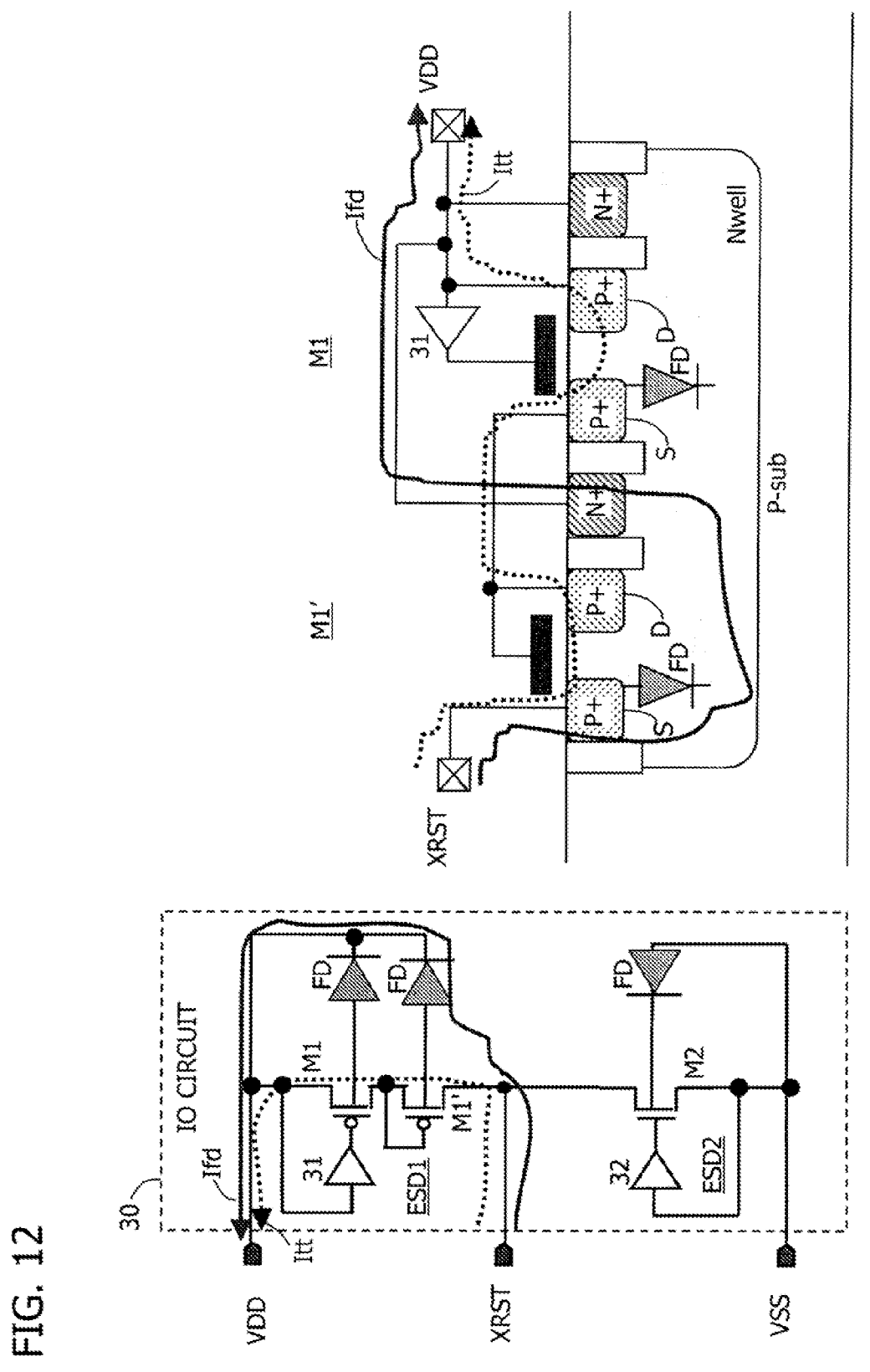

FIG. 12 is a diagram depicting the circuit and chip cross section of the second example of the IO circuit of the integrated circuit according to the first embodiment. With this second example, in the unidirectional circuit ESD1 between the input terminal XRST and the power terminal VDD, the first and second transistors M1, M1' are P-channel MOS transistors, the second transistor M1' is provided between the first transistor M1 and the input terminal XRST, and its gate is connected to a source terminal S of the first transistor M1. Moreover, the two transistors M1, M1' are both formed in the same N-type well region Nwell. The N-type well region Nwell is supplied with the back gate bias from the power terminal VDD via the N-type contact region. In this first example, when the power terminal VDD becomes an open state and becomes lower than the potential of the power source B-VDD of the input terminal XRST, the second transistor M1' is also conducted.

As depicted in FIG. 12, as the current paths from the input terminal XRST to the power terminal VDD, there are a current path Itt that passes between the source and drain of two transistors M1, M1', and a current path Ifd that passes through a field diode FD configured from a PN junction between the P-type source region S and N-type well region Nwell of the second transistor M1'. The voltage drop of the current path Itt is 2×PMOSVth, and the voltage drop of the current path Ifd is FDVth. Although will also depend on the device design, if 2×PMOSVth≈FDVth, current will flow to both current paths, and the voltage of the power terminal VDD in an open state becomes as follows.

VDD=XRST−FDVth

However, if the number of second transistors M1' is increased, the voltage drop of the current path Itt becomes N×PMOSVth (N is the number of transistors M1, M1'), which results in N×PMOSVth>FDVth, the current path Ifd becomes dominant, and the voltage of the power terminal VDD will not fall below the foregoing XRST−FDVth.

Figure 13:
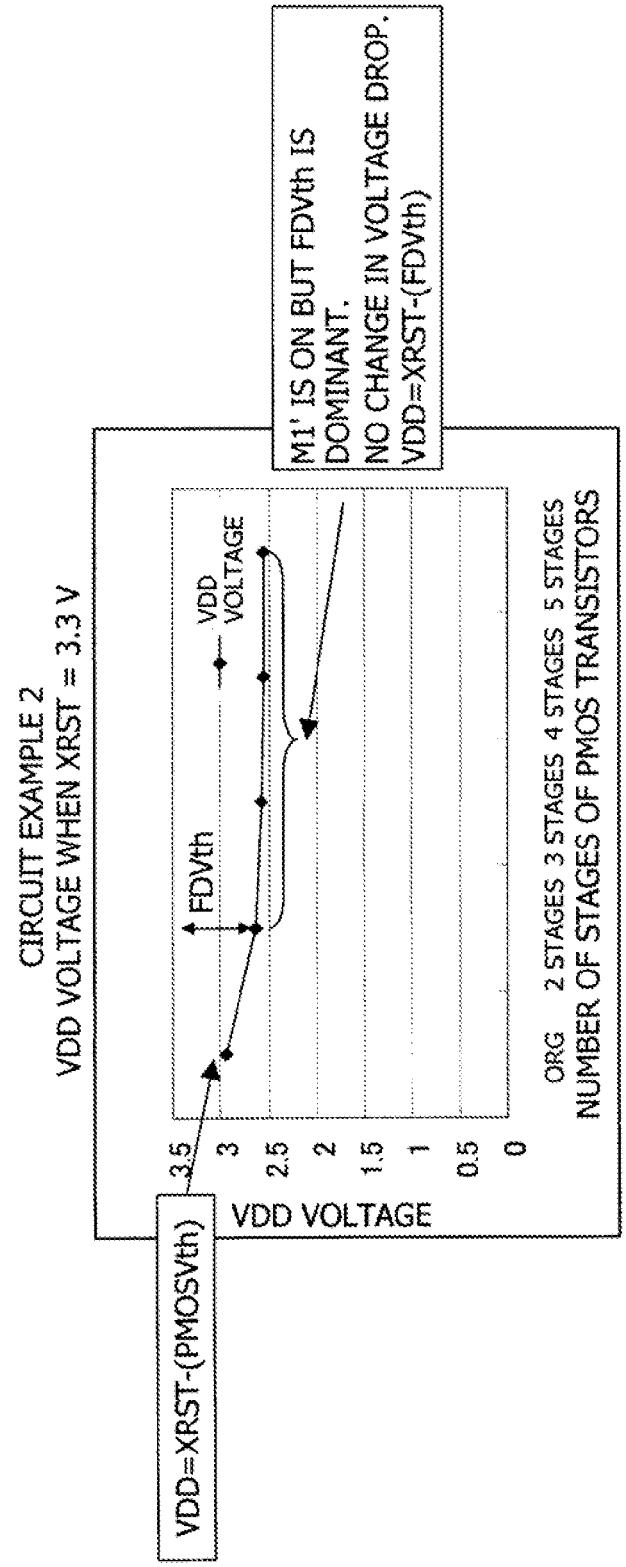
FIG. 13 is a diagram depicting the voltage of the power terminal VDD in a VDD open state when the second transistor M1' is increased in the IO circuit of the second example.

FIG. 13 is a diagram depicting the voltage of the power terminal VDD in a VDD open state when the second transistor M1' is increased in the IO circuit of the second example. As described above, even if the second transistor M1' is increased, the voltage of the power terminal VDD will be constant at VDD=XRST−FDVth.

As described above, even with the IO circuit of the second example, the voltage of the power terminal in a case where the power terminal VDD is open can be made lower than the case depicted in FIG. 2. Thus, as with the first example, it is possible to inhibit the erroneous detection of the open state of the power terminal VDD in cases where the power terminal VDD is connected normally.

Figure 14:
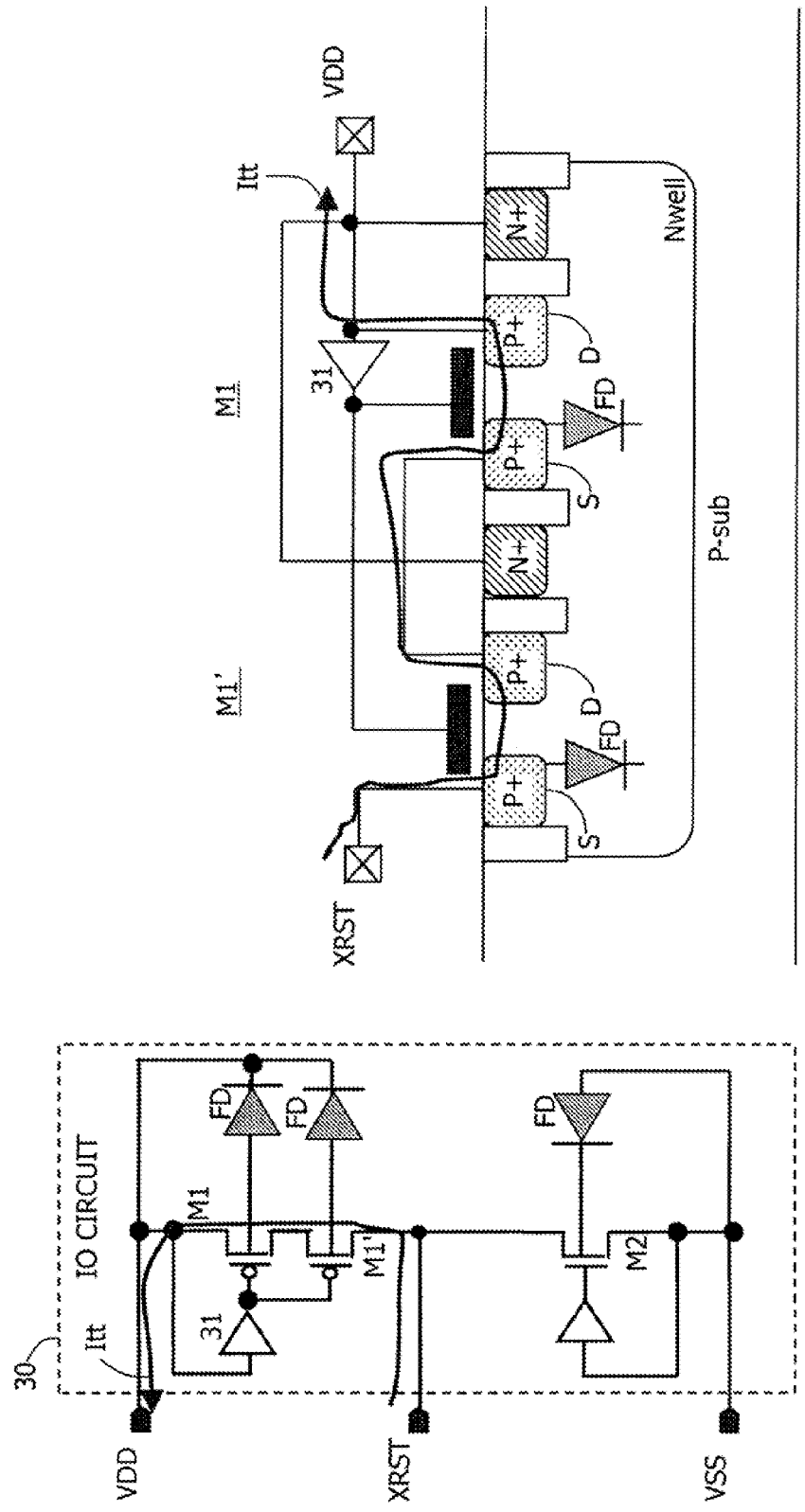
FIG. 14 is a diagram depicting the circuit and chip cross section of the third example of the IO circuit of the integrated circuit according to the first embodiment.

FIG. 14 is a diagram depicting the circuit and chip cross section of the third example of the IO circuit of the integrated circuit according to the first embodiment. With this third example, in the unidirectional circuit ESD1 between the input terminal XRST and the power terminal VDD, the first and second transistors M1, M1' are P-channel MOS transistors, the second transistor M1' is provided between the first transistor M1 and the input terminal XRST, and its gate is connected to a gate of the first transistor M1. Moreover, the two transistors M1, M1' are both formed in the same N-type well region Nwell. The N-type well region Nwell is supplied with the back gate bias from the power terminal VDD via the N-type contact region. However, the position of the transistors M1, M1' may be vertically inverted.

In this third example, when the power terminal VDD becomes an open state and becomes lower than the potential of the power source B-VDD of the input terminal XRST, both the first and second transistors M1, M1' are conducted. In other words, the two transistors M1, M1' are substantially the same as a single PMOS transistor.

In the foregoing case, since the voltage drop of the current path Itt in FIG. 14 is the threshold PMOSVth of the transistor and smaller than the voltage drop FDVth (>PMOSVth) of the current path that passes through the field diode FD, the current path Itt becomes dominant.

Since the total channel length of the transistor has been extended by the transistors M1, M1', the threshold PMOSVth of the transistor becomes greater in comparison to the case of FIG. 2 in which only the first transistor M1 is conducted. Thus, the voltage drop of the power terminal VDD when the power terminal VDD is open can be lowered than the case depicted in FIG. 2 by that much. In other words, as with the first example, it is possible to inhibit the erroneous detection of the open state of the power terminal VDD when the power terminal VDD is connected normally.

In the third example, the voltage of the power terminal VDD when the power terminal VDD becomes an open state is as follows.

VDD=XRST−PMOSVth (greater L)

This voltage becomes lower than the VDD=XRST−PMOSVth of FIG. 2.

Figure 15:
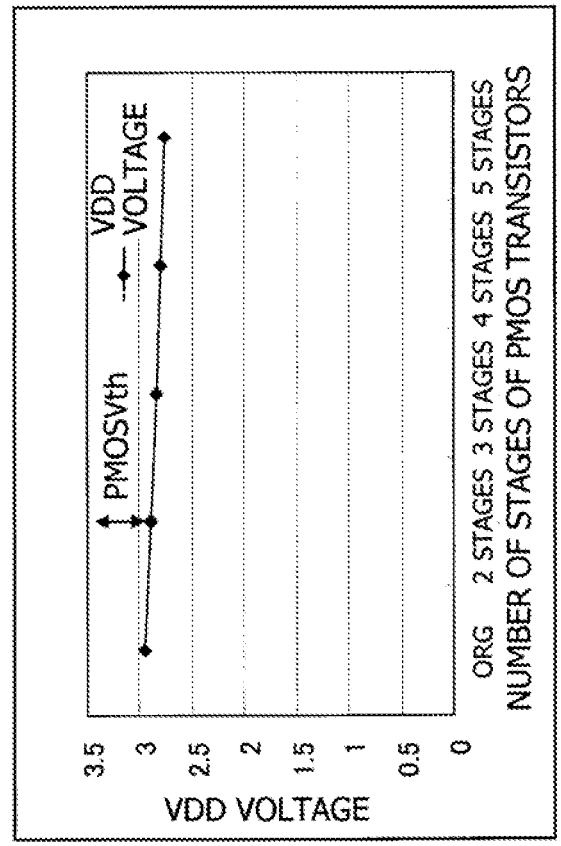
FIG. 15 is a diagram depicting the voltage of the power terminal VDD in a VDD open state when the second transistor M1' is increased in the IO circuit of the third example.

FIG. 15 is a diagram depicting the voltage of the power terminal VDD in a VDD open state when the second transistor M1' is increased in the IO circuit of the third example. If the number of second transistors M1' is increased, the total channel length L of such transistors will increase, and the threshold voltage PMOSVth (greater L) will increase proportionally to the number of transistors. However, when the PMOVth (greater L) reaches the threshold FDVth of the field diode, the voltage of the power terminal VDD thereafter becomes saturated at VDD=XRST−FDVth.

Figure 16:
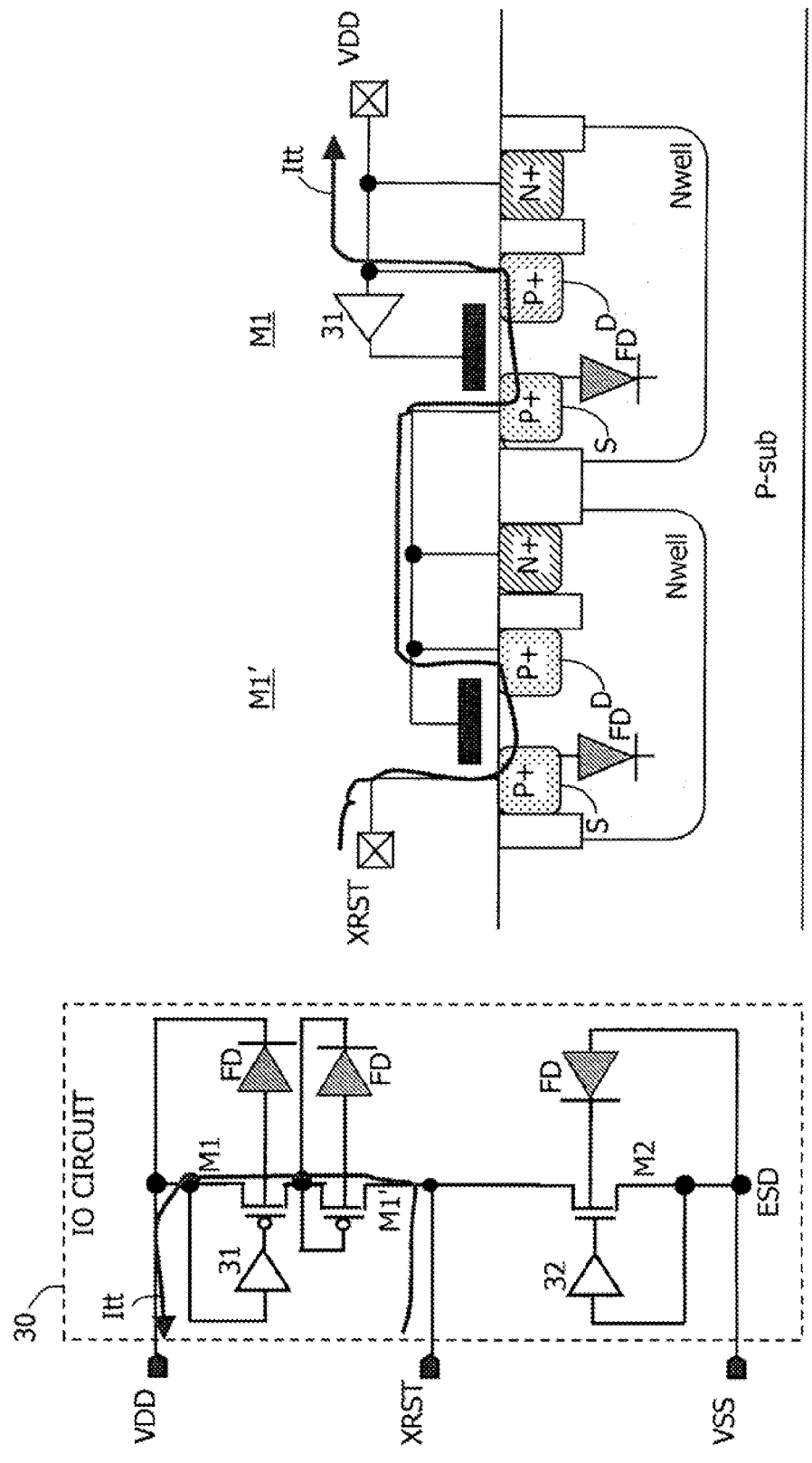
FIG. 16 is a diagram depicting the circuit and chip cross section of the fourth example of the IO circuit of the integrated circuit according to the first embodiment.

FIG. 16 is a diagram depicting the circuit and chip cross section of the fourth example of the IO circuit of the integrated circuit according to the first embodiment. With this fourth example, in the unidirectional circuit ESD1 between the input terminal XRST and the power terminal VDD, the first and second transistors M1, M1' are P-channel MOS transistors, the second transistor M1' is provided between the first transistor M1 and the input terminal XRST, and its gate is connected to a source terminal S of the first transistor M1. Moreover, the two transistors M1, M1' are respectively formed in separate N-type well regions Nwell. In addition, the first transistor M1 is supplied with the back gate bias from the power terminal VDD and the second transistor M1' is supplied with the back gate bias from the source terminal of the transistor M1.

In this fourth example, when the power terminal VDD becomes an open state and becomes lower than the potential of the power source B-VDD of the input terminal XRST, the current path Itt that passes between the source and drain of the first and second transistors M1, M1' becomes dominant. In other words, since both transistors M1, M1' are formed in separate N-type well regions Nwell, in the respective transistors, there are a current path that passes between the source and drain, and a current path that passes through the field diode FD of the PN junction between the source and the Nwell region. However, since the voltage drop PMOSVth of the former is smaller than the voltage drop FDVth of the latter, the current path Itt that passes between the source and drain becomes dominant in both transistors.

When the transistors M1, M1' are provided as depicted in FIG. 16, the voltage of the VDD when the power terminal VDD is in an open state will be as follows.

$$VDD=XRST-2\times PMOSVth$$

The potential of the power terminal VDD is lower than the VDD=XRST−PMOSVth of the example depicted in FIG. 2. Thus, it is possible to inhibit the erroneous detection of the open state of the power terminal VDD when the power terminal VDD is connected normally.

Figure 17:
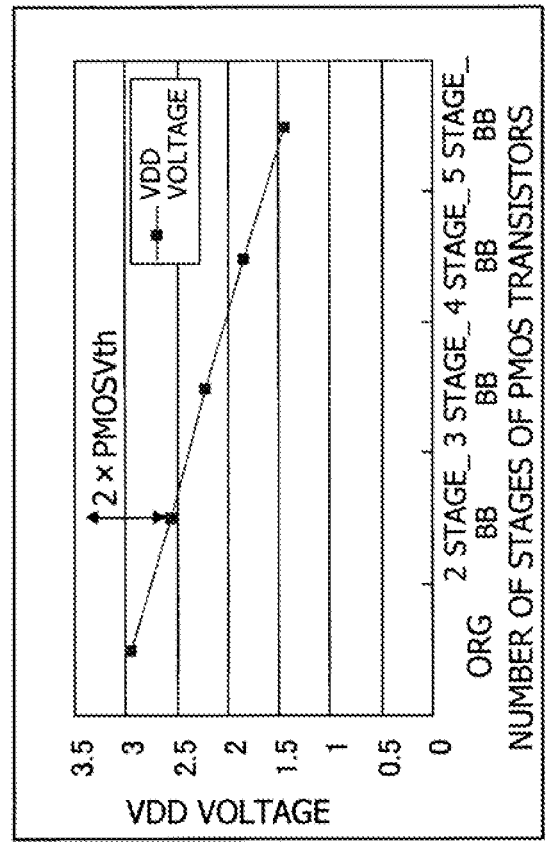
FIG. 17 is a diagram depicting the voltage of the power terminal VDD in a VDD open state when the second transistor M1' is increased in the IO circuit of the fourth example.

FIG. 17 is a diagram depicting the voltage of the power terminal VDD in a VDD open state when the second transistor M1' is increased in the IO circuit of the fourth example. Each time the second transistor M1' is increased, the voltage of the power terminal VDD will drop by PMOSVth each time. Thus, the voltage of the power terminal VDD in cases where the total number of first and second transistors M1, M1' is N will be as follows.

$$VDD=XRST-N\times PMOSVth$$

Accordingly, as a result of increasing the stages of the second transistor M2', the operation margin of the power open determination circuit can be increased further.

Figure 18:
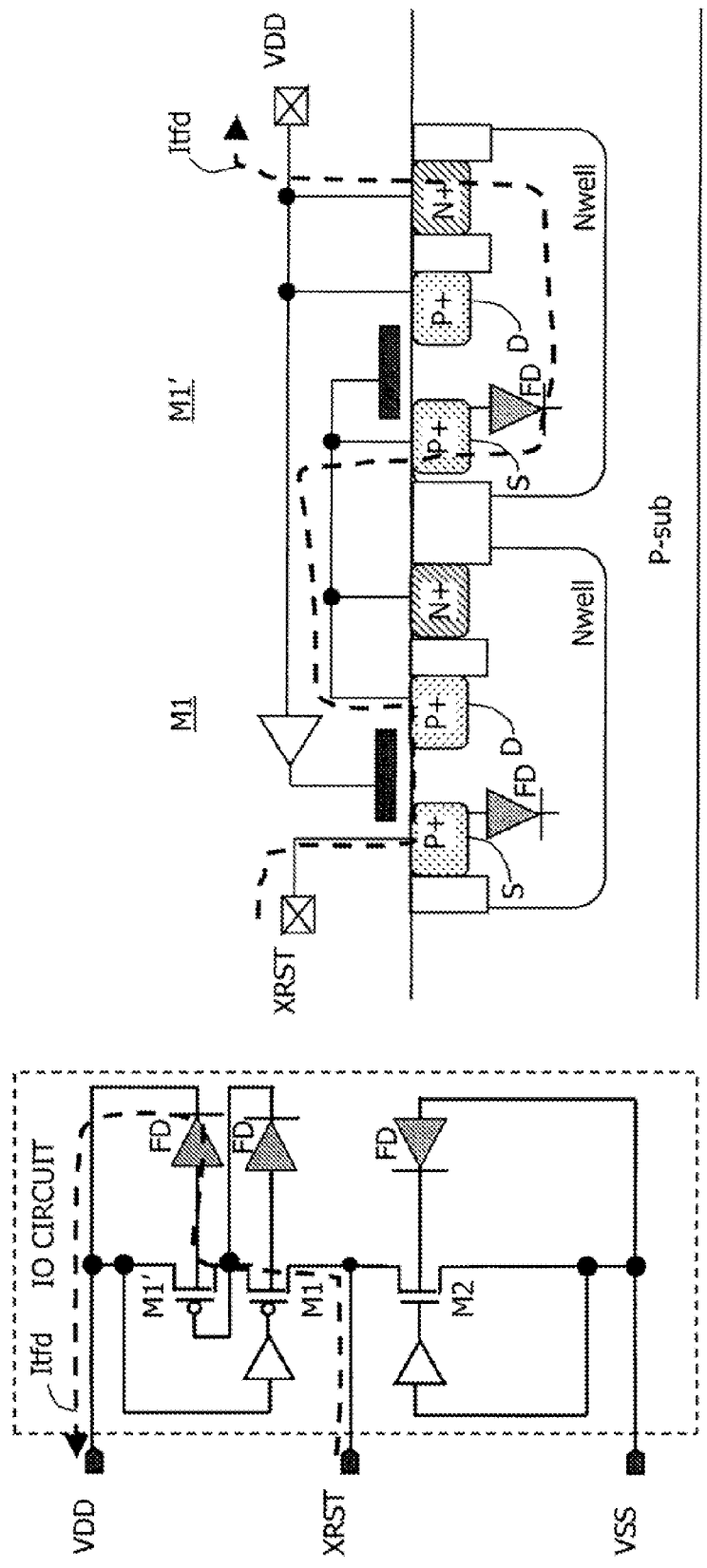
FIG. 18 is a diagram depicting the circuit and chip cross section of the fifth example of the IO circuit of the integrated circuit according to the first embodiment.

FIG. 18 is a diagram depicting the circuit and chip cross section of the fifth example of the IO circuit of the integrated circuit according to the first embodiment. With this fifth example, in the unidirectional circuit ESD1 between the input terminal XRST and the power terminal VDD, the first and second transistors M1, M1' are P-channel MOS transistors, the second transistor M1' is provided between the first transistor M1 and the power terminal VDD, and its gate is connected to a drain terminal D of the first transistor M1. Moreover, the two transistors M1, M1' are respectively formed in separate N-type well regions Nwell. In addition, the second transistor M1' is applied with the back gate bias from the power terminal VDD, and the first transistor M1 is applied with the back gate bias from the source terminal S of the transistor M1'.

In this fifth example, when the power terminal VDD becomes an open state and becomes lower than the potential of the power source B-VDD of the input terminal XRST, the second transistor M1' is an OFF state. Accordingly, the current path that passes between the source and drain becomes dominant in the first transistor M1, but only a current path that passes through the field diode FD is formed in the second transistor M1'. Consequently, the current path Itfd in FIG. 18 becomes dominant. In other words, the path between the source and drain becomes dominant in the first transistor M1, and the path of the field diode FD becomes dominant in the second transistor M1'.

When the transistors M1, M1' are provided as depicted in FIG. 18, the voltage of the VDD when the power terminal VDD is in an open state will be as follows.

$$VDD=XRST-PMOSVth-FDVth$$

The potential of the power terminal VDD is lower than the VDD=XRST−PMOSVth of the example depicted in FIG. 2. Thus, it is possible to inhibit the erroneous detection of the open state of the power terminal VDD when the power terminal VDD is connected normally.

Figure 19:
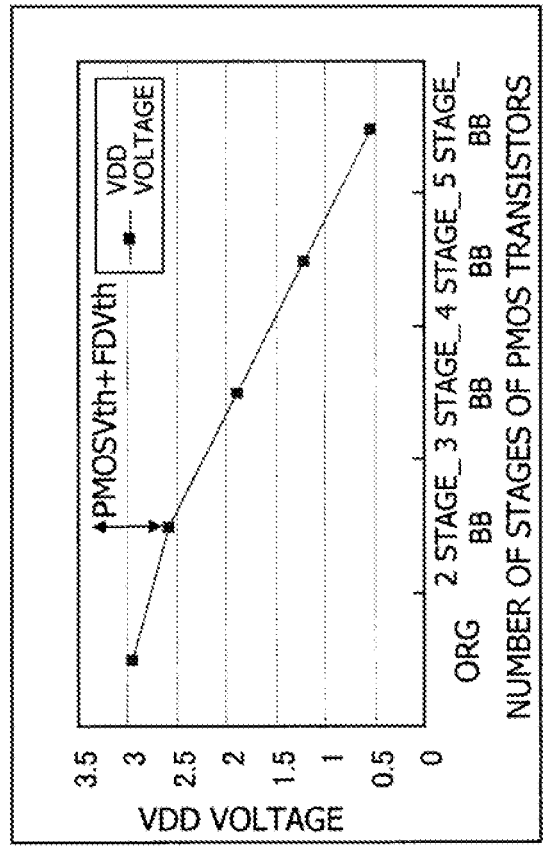
FIG. 19 is a diagram depicting the voltage of the power terminal VDD in a VDD open state when the second transistor M1' is increased in the IO circuit of the fifth example.

FIG. 19 is a diagram depicting the voltage of the power terminal VDD in a VDD open state when the second transistor M1' is increased in the IO circuit of the fifth example. Each time the second transistor M1' is increased, the voltage of the power terminal VDD will drop by FDVth each time. Thus, the voltage of the power terminal VDD in cases where the total number of second transistors M1' is N−1 will be as follows.

$$VDD=XRST-PMOSVth-(N-1)\times FDVth$$

Figure 20:
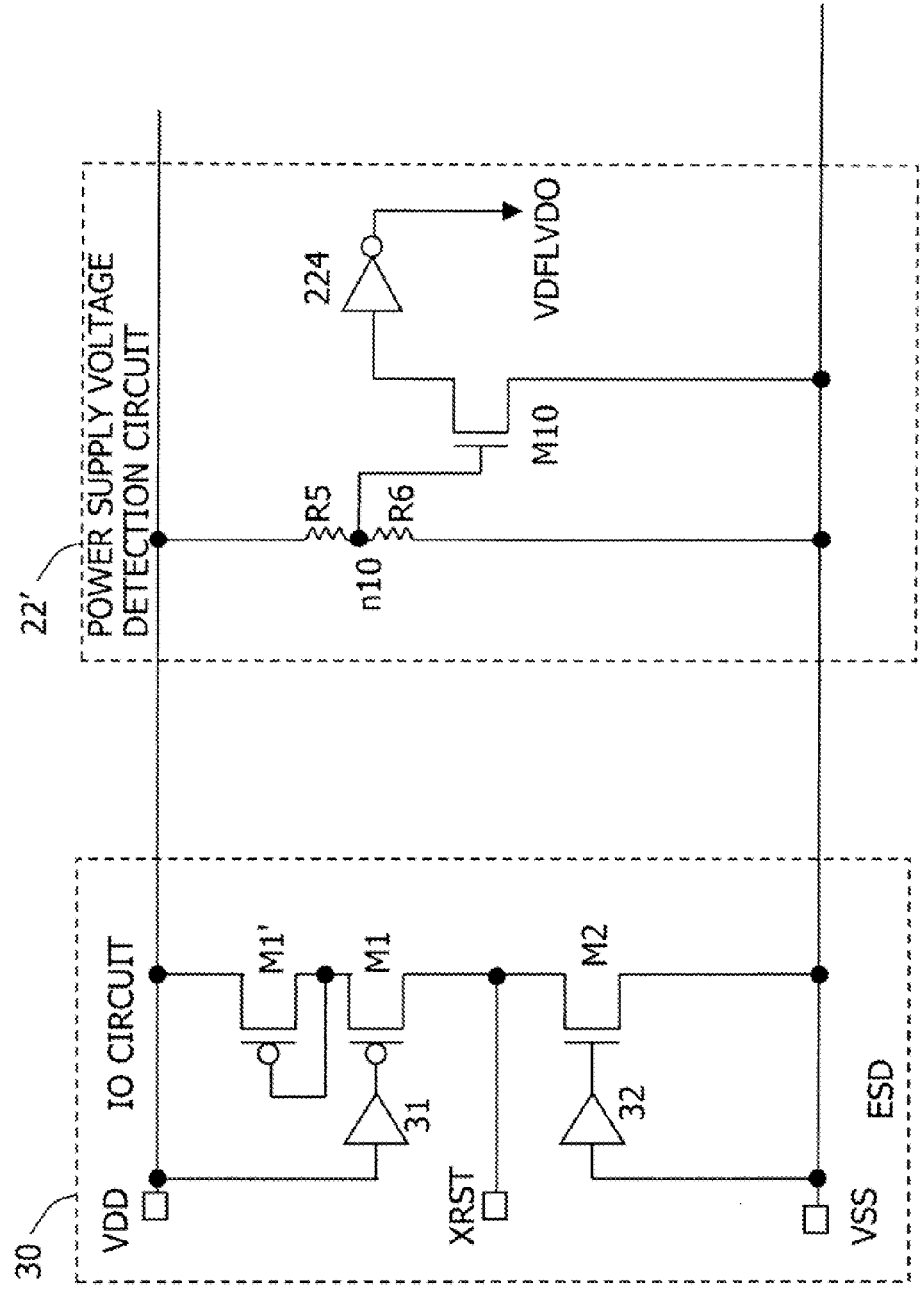
FIG. 20 is a diagram depicting a modified example of the power open determination circuit according to the first embodiment.

FIG. 20 is a diagram depicting a modified example of the power open determination circuit according to the first embodiment. In FIG. 20, the unidirectional circuit between the input terminal XRST and the power terminal VDD in the IO cell 30 is the same as the first example of FIGS. 6, 7, and 8. In addition, the power supply voltage detection circuit 22' of FIG. 20 differs from the power open determination circuit 22 of FIG. 6.

Specifically, the power supply voltage detection circuit 22' of FIG. 20 only detects whether the voltage of the power terminal VDD dropped lower than the reference voltage. It does not compare the voltage-dividing level of the voltage of the power terminal VDD and the voltage-dividing level of the voltage of the input terminal XRST as depicted in FIG. 6.

The power supply voltage detection circuit 22' of FIG. 20 divides the power terminal VDD with the resistors R5, R6, and connects the divided node n10 to a gate of the N-channel transistor M10. Since the source of the transistor M10 is connected to the ground terminal VSS, if the voltage-dividing level of the node n10 is higher than the threshold voltage NMOSVth of the transistor M10, it turns ON the transistor M10 and the detection signal VDFLVDO becomes an H-level, and, if it is lower, it turns OFF the transistor M10 and the detection signal FDFLVDO becomes al L-level.

The power supply voltage detection circuit 22' simply detects whether the power supply voltage VDD dropped lower than an absolute value. Accordingly, it is also possible to detect cases where the power terminal VDD becomes an open state and the voltage of the power terminal VDD drops considerably due to the first and second transistors M1, M1' in the IO cell 30 described above. Moreover, it is also possible to detect cases where the power terminal VDD drops lower than a normal level for some reason. In other words, it functions concurrently as a circuit for detecting the drop in the power supply voltage VDD and as a circuit for detecting the open state of the power terminal VDD. However, both states is better to cause the same level of voltage drop to the power terminal VDD. Accordingly, the circuit configuration of the first and second transistors M1, M1' in the IO cell needs to be selected so that it matches the level of detecting the voltage drop of the power supply voltage VDD.

Moreover, since the power supply voltage detection circuit 22' is comparing the voltage drop of the power supply voltage VDD with an absolute value, if it free from false detections that occur when the input terminal XRST overshoots or rises higher than the potential of the power terminal VDD as explained with reference to FIG. 5.

Note that, in the power supply voltage detection circuit 22' of FIG. 20, in substitute for the transistor M10, a comparator for comparing the voltage of the node n10 and an absolute reference voltage may be used. In the foregoing case also, the comparator detects a drop in the power terminal VDD and generates a power state detection signal.

As described above, in the first embodiment, illustrated are examples of five integrated circuits. As depicted in these examples, the unidirectional circuit provided between the input terminal XRST and the power terminal VDD is configured from a plurality of PMOS transistors. Accordingly, as described above, it is possible to lower the voltage drop of the power terminal VDD when the power terminal VDD becomes an open state. Consequently, it is possible to inhibit the erroneous detection of the VDD open state when the power terminal VDD is connected normally.

Second Embodiment

The second embodiment relates to a VSS open detection circuit which detects a VSS open state.

Figure 21:
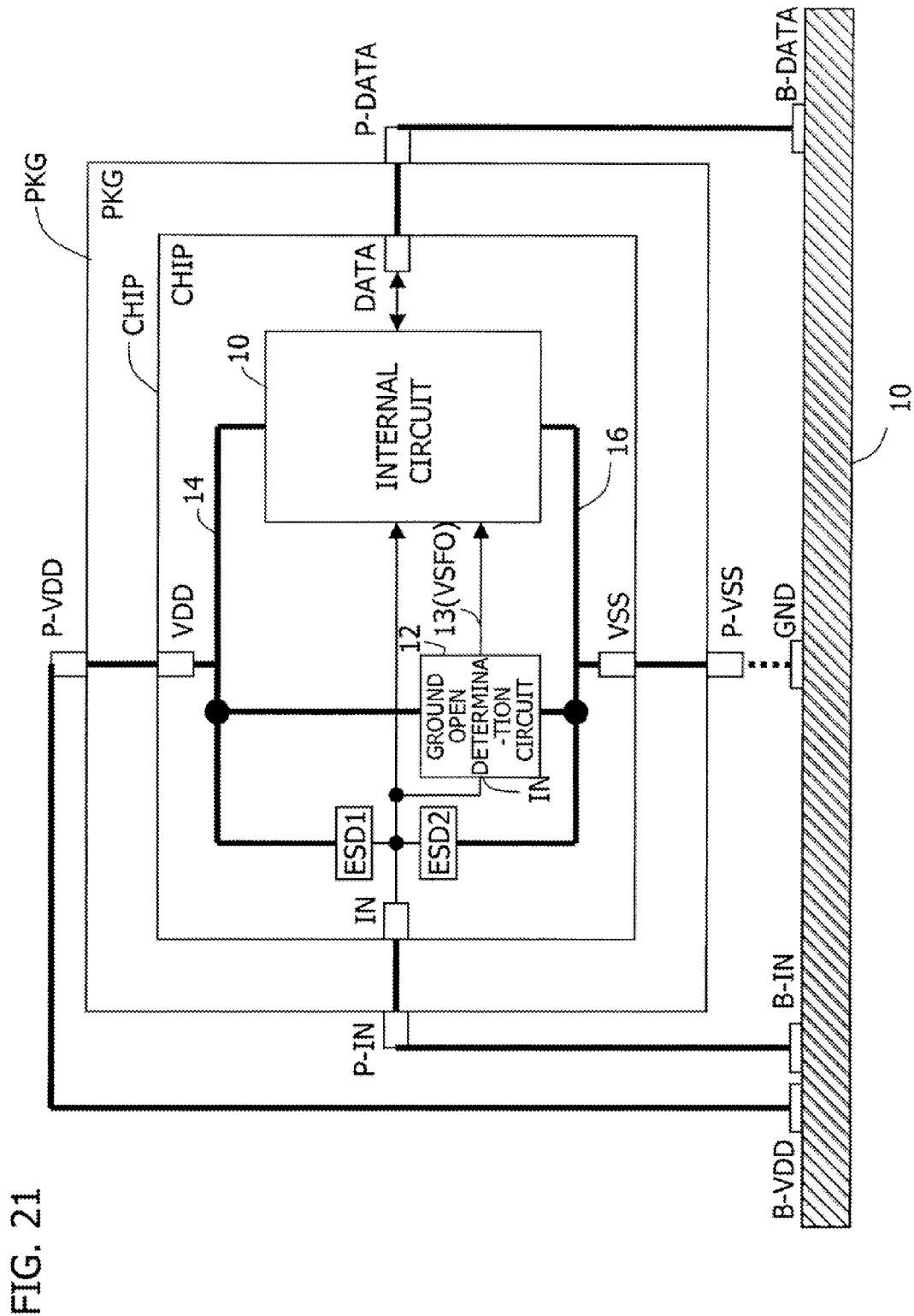
FIG. 21 is a configuration diagram of the integrated circuit device according to the second embodiment.

FIG. 21 is a configuration diagram of the integrated circuit device according to the second embodiment. As with FIG. 1, the chip CHIP in which an integrated circuit is formed thereon is housed in a package PKG, and the package PKG is mounted on a circuit board 20. In the second embodiment, provided is a ground open determination circuit 12 (power state determination circuit) which detects an open state where the ground terminal VSS is not electrically connected to the external ground terminal GND. The ground open determination circuit 12 is provided between the power wiring 14 and the ground wiring 16, and detects that the potential of the input terminal IN with L level and the potential of the ground terminal VSS became different potentials when the ground terminal VSS becomes an open state for some reason. The electrostatic breakdown protection elements ESD1, ESD2 are the same as FIG. 1, and, if static of a high positive electric potential or negative electric potential is applied to the input terminal IN, they release the electric charge of such static in the power terminal VDD direction or the ground terminal VSS direction.

When the ground terminal VSS becomes an open state, the electrostatic breakdown protection element ESD2 is conducted, and the potential of the ground wiring 16 becomes higher than the external ground potential GND. The ground open determination circuit 12 detects the potential of the ground terminal VSS and the ground wiring 16 connected thereto becoming higher than the external ground potential GND.

A signal of the ground potential is supplied to the input terminal IN in a normal operation state. In other words, the ground open determination circuit 12 detects a ground open state when a signal of the ground potential is being supplied to the input terminal IN. Accordingly, the input terminal IN is preferably input with, for example, a control signal which becomes an L-level; that is, a ground potential during normal operation, a clock signal which repeats the L-level and H-level (ground potential and power supply voltage potential), or the like.

In addition, when the ground open determination circuit 12 detects a ground open state, it outputs the detection signal 13 thereof to the internal circuit 10, and stops the operation of the internal circuit 10. As a specific example of stopping the operation, the data output that is output from the data I/O terminal DATA of the internal circuit 10 is fixed to the level of either H or L. Otherwise, a high impedance state is realized. It is thereby possible to avoid an erroneous data output being made to an external device in a ground open state and thereby causing a malfunction.

Cases of a ground open state where the ground terminal VSS in the chip is not electrically connected to the external ground terminal GND may occur, for example, when there is a bad solder connection between the ground terminal GND of the circuit board 20 and the ground terminal P-VSS of the package PKG, or when there is a bad connection between the ground terminal P-VSS of the package PKG and the ground terminal VSS of the chip.

Figure 22:
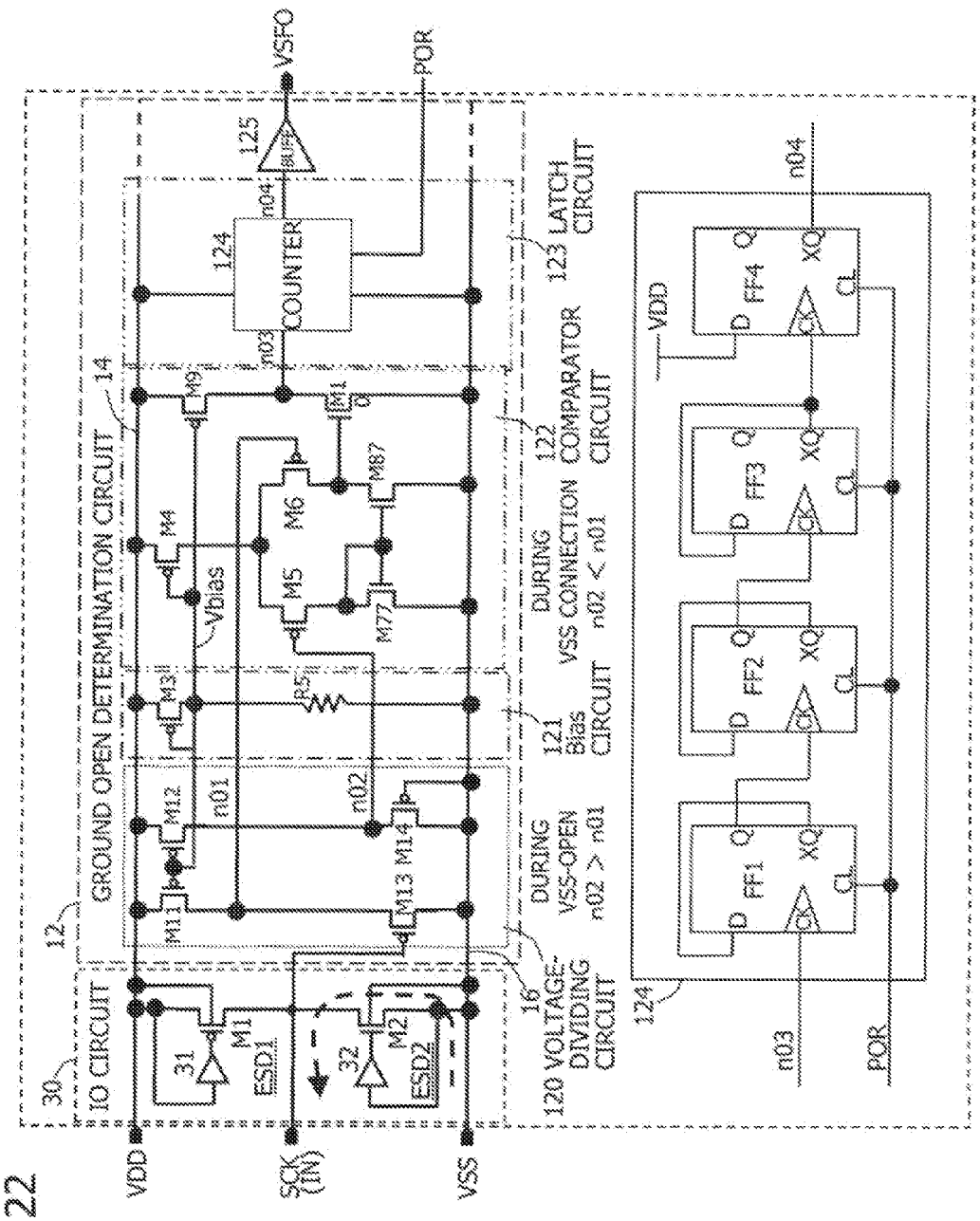
FIG. 22 is a circuit diagram depicting an example of the ground open determination circuit.

FIG. 22 is a circuit diagram depicting an example of the ground open determination circuit. As explained with reference to FIG. 21, the power wiring 14 is connected to the power terminal VDD, and the ground wiring 16 is connected to the ground terminal VSS. In the example of FIG. 22, a clock terminal SCK is used as the input terminal IN. A diode-connected P-channel transistor M1 having a short circuit of the gate and drain is provided as the electrostatic breakdown protection element ESD1 between the clock terminal SCK and the power terminal VDD, and a diode-connected N-channel transistor M2 having a short circuit of the gate and drain is provided as the electrostatic breakdown protection element ESD2 between the clock terminal SCK and the ground VSS. In a normal operation state, since a clock signal which alternately includes the potentials of the power source VDD and the ground VSS is supplied to the clock terminal SCK, neither of the transistors M1, M2 are conducted, and there is no influence on the normal operation. Moreover, if static is applied to the clock terminal SCK, the transistor M1 or M2 is conducted and causes the electric charge of the static to flow to the power terminal VDD or the ground terminal VSS.

The ground open determination circuit 12 includes a signal voltage-dividing circuit 120 having a P-channel first transistor M13 in which the clock terminal SCK is connected to a gate and the source and drain are connected between the power terminal VDD and the ground terminal VSS, and a P-channel second transistor M14 in which the ground terminal VSS is connected to a gate and the source and drain are connected between the power terminal VDD and the ground terminal VSS. In addition, the ground open determination circuit 12 includes a comparator circuit 122 which compares the potentials of the nodes n01, n02 between the drain and power terminal VDD of the first and second transistors M13, M14, and outputs a ground open detection signal n03 (L-level) informing a ground open state, a latch circuit 123 which latches and counts the signals of the output n03 of the comparator, and a buffer circuit 125. Moreover, a bias circuit 121 is also provided.

The bias circuit 121 and the comparator circuit 122 are configured the same as the bias circuit 221 and the comparator 22 of FIG. 2, and the explanation thereof is omitted.

The latch circuit 123 includes a counter 124, and the counter 124 has four flip-flops FF1 to FF4 as depicted in FIG. 22. The counter 124 is reset by the power ON reset signal POR, and, upon counting the comparator output n03 five times, outputs an L-level node n04. This signal n04 is output as a ground open detection signal VSFO via the buffer circuit 125.

The first and second transistors M13, M14 are both P-channel transistors, and current source circuits configured from the P-channel transistors M11, M12 in which a bias voltage Vbias has been applied to the gate are respectively provided between the source and power source VDD thereof.

The potential of the node n01 is decided based on the ON resistor ratio of the transistors M11, M13, and, similarly, the potential of the node n02 is decided based on the ON resistor ratio of the transistors M12, M14.

In this example, the transistor size of the transistors M11, M12 is set to be equal, and, since the gate bias voltages Vbias are the same, the ON resistors RM11, RM12 of the transistors M11, M12 are approximately equal. Meanwhile, with respect to the transistor size of the transistors M13, M14, when the gate voltage is the same, the ON resistor RM13 of the transistor M13 is designed to be larger than the ON resistor RM14 of the transistor M14 (RM13>RM14). Specifically, for example, the gate length of the transistor M13 is longer than the gate length of the transistor M14.

Thus, when the ground terminal VSS of the chip is properly connected to the external ground terminal GND, the voltage Vn01 of the node n01 will be higher than the voltage Vn02 of the node n02. Specifically, it will be as follows.

Vn01=RM13*VDD/(RM11+RM13)

Vn02=RM14*VDD/(RM12+RM14)

Since RM13>RM14, RM11=RM12, it becomes vn01>vn02. Consequently, the comparator 122 sets the output n03 to an H-level. This is detecting a state where the ground terminal VSS of the chip is connected to the external ground terminal GND.

The open state where the ground terminal VSS of the chip is not connected to the external ground terminal GND is now explained. The clock terminal SCK is connected to the gate of the transistor M13, and, when a signal of the voltage of the ground VSS is input to the clock terminal SCK in a normal operation state, the transistor M13 is in a conducted state. The current path of the power terminal VDD, the transistor M11, and the transistor M13 is thereby formed. Thus, when the ground terminal VSS is opened, the transistor M2 is conducted by the current path, and the ground terminal VSS and its wiring 16 become higher than the ground potential of the clock terminal SCK by the threshold voltage NMOSVth of the transistor M2. In other words, it becomes VSS=SCK (GND)+NMOSVth.

As described above, the ground potential of the clock terminal SCK is applied to the gate of the transistor M13, and VSS=NMOSVth is applied to the gate of the transistor M14. Thus, the transistors M13, M14 are designed so that the ON resistors RM13, RM14 of the transistors M13, M14 in the foregoing case will be RM13<RM14. In other words, the design is such that the relation will be the opposite as the ON resistor when the ground terminal VSS of the chip is connected to the external ground terminal GND. Since the potential of the ground terminal VSS and the wiring 16 in the chip is NMOSVth, the potentials of the nodes n01, n02 will be as follows.

Vn01=RM13*(VDD−NMOSVth)/(RM13+RM11)

Vn02=RM14*(VDD−NMOSVth)/(RM14+RM12)

Since RM13<RM14, RM11=RM12, it becomes vn01<vn02. Consequently, the comparator 122 is reversed and sets the output node n03 to an L-level. This is detecting an open state where the ground terminal VSS of the chip is not connected to the external ground terminal GND.

Figure 23:
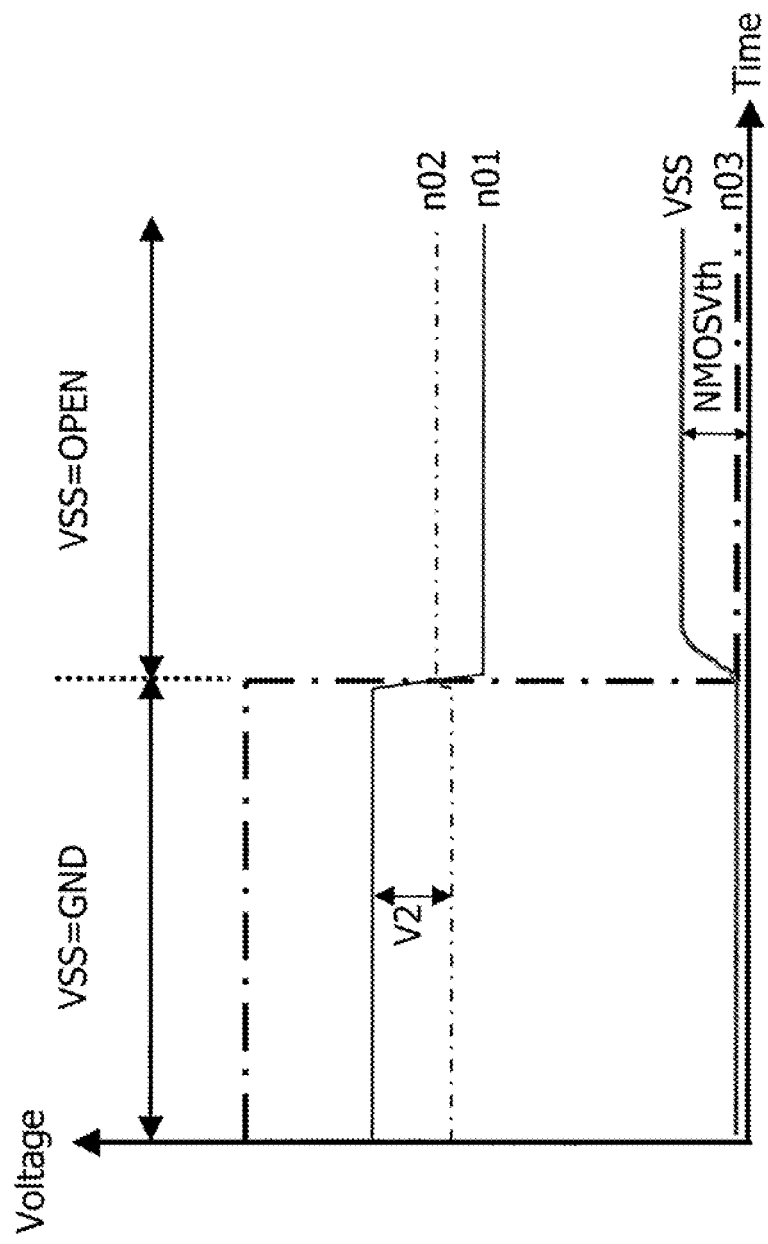
FIG. 23 is a waveform diagram showing the operation of the ground open determination circuit of FIG. 22.

FIG. 23 is a waveform diagram showing the operation of the ground open determination circuit of FIG. 22. When the ground terminal VSS in the chip is connected to the external ground terminal GND (VSS=GND), the ground terminal VSS in the chip becomes a ground potential (0V), whereby Vn01>Vn02, and the comparator output node n03 becomes an H-level. Meanwhile, when the ground terminal VSS in the chip is not connected to the external ground terminal GND and is in an open state (VSS=OPEN), the ground terminal VSS in the chip will rise to NMOSVth, whereby Vn01<Vn02, and the comparator output node n03 becomes an L-level. This L-level is the same as the ground potential VSS in the chip.

Returning to FIG. 22, the H-level and L-level are repeated to the clock terminal SCK. In cases where the clock terminal SCK is an L-level, the VSS open detection circuit performs the operation as described above and, if the VSS is in an open state, the comparator output node n03 becomes an L-level. Meanwhile, if the clock terminal SCK is an H-level, the transistor M13 is turned OFF, whereby Vno1>Vno2, and the comparator output node n03 becomes an H-level. In other words, when the ground terminal VSS becomes an open state in a normal operation state, the comparator output node n03 synchs with the clock SCK and repeats the H-level and the L-level. Thus, when the counter 124 counts the H-level of the node n03 five times, an L-level is output to the counter output node n04, and a VSS open detection signal VSFO is output from the buffer 125.

Figure 24:
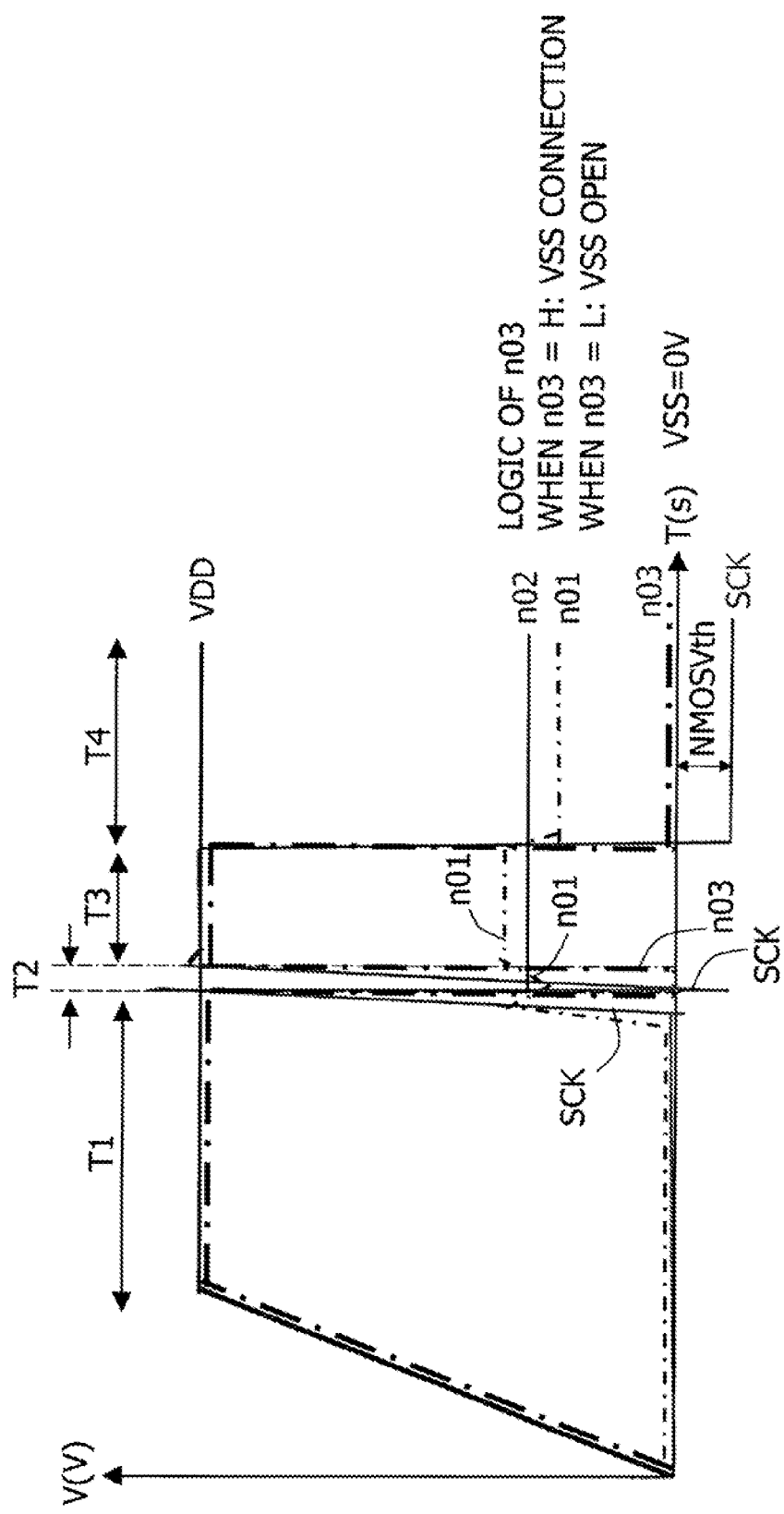
FIG. 24 is a diagram explaining the operation of the ground open determination circuit of FIG. 22.

FIG. 24 is a diagram explaining the operation of the ground open determination circuit of FIG. 22. FIG. 24 depicts a case T2 of an undershoot voltage being applied to SCK when the clock terminal SCK as the input terminal rises in a state where the ground terminal VSS is connected normally, and a case T4 of SCK becoming a lower potential than the ground VSS for some reason.

In FIG. 22, when the ground terminal VSS is connected normally, the operation margin V2 between the nodes n01, n02 in a relation of n01>n02 is not that large. The reason for this is because it is necessary to set the On resistors of the transistors M11, M12, M13, M14 to become n01<n02 when the ground terminal VSS rises in an open state.

After the power boot time T1, in the normal operation state T3 after the clock signal SCK has risen from the L-level to the H-level, it is n01>n02 and the comparator output n03 is at an H-level. Nevertheless, in the case T2 where an undershoot voltage is applied to SCK after the clock terminal SCK as the input terminal rises, the ON resistor of the transistor M13 becomes smaller than the ON resistor of the transistor M14, and becomes n01<n02. Consequently, the node n03 is of an L-level. Similarly, even in the case T4 where the clock terminal SCK is of a lower potential than the ground terminal VSS, it becomes n01<n02, and the node n03 is of an L-level. In other words, in the states T2, T4, the potential of the clock terminal SCK is as follows.

SCK<VSS−NMOSVth

In other words, a voltage difference that is substantially the same as the VSS open state is generated between the clock terminal SCK and the ground terminal VSS, and the ground open determination circuit 12 sets the node n03 to an L-level, and is erroneously detecting the VSS open state.

FIG. 25 is a diagram depicting the first example of the IO circuit of the integrated circuit according to the second embodiment and the cross section on its chip. As with FIG. 22, an N-channel MOS transistor M1 and a buffer 31 are provided to the unidirectional circuit unidirectional circuit between the clock terminal SCK and the power terminal VDD, and the electric charge of the positive static of the clock terminal SCK is caused to flow thereby. Meanwhile, in addition to an N-channel MOS transistor M2 and a buffer 32 being provided to the unidirectional circuit between the clock terminal SCK and the ground terminal VSS, an N-channel MOS transistor M2' is provided between the transistor M2 and the ground terminal VSS. A gate of the transistor M2' is connected to a drain D of the transistor M2. In addition, both transistors M1, M2' are supplied with the back gate bias from the ground terminal VSS. The transistor M2' is constantly OFF since the gate and source are short circuited.

In the IO circuit 30, as the current paths when the ground terminal VSS becomes an open state and becomes higher than the L-level (external ground potential GND) of the clock terminal SCK, there are the current paths Ifdt and Ifd depicted in FIG. 25. In other words, the current path Ifdt is as follows: VSS–field diode FD between the P-Sub and source S of the transistor M2'–drain and source of the transistor M2–SCK. The current path Ifd is as follows: VSS–field diode FD of the transistor M2–SCK. With these current paths, since the voltage drop of the current path Ifd is the threshold voltage FDVth of the field diode FD and smaller than the voltage drop FDVth+NMOSVth of the current path Ifdt, the current path Ifd becomes dominant.

Accordingly, with the configuration of the IO circuit 30 of FIG. 25, when the ground terminal VSS becomes an open state, the ground terminal VSS becomes a voltage that is higher than the L-level (external ground GND) of the clock terminal SCK by FDVth. The voltage FDVth of the ground terminal VSS becomes higher than NMOSVth of FIG. 22. Specifically, since FDVth≅2NM0SVth, it becomes FDVth>NMOSVth. In addition, even if the second transistor M2' is further increased, since it will be in an OFF state, the relation of VSS=SCK(GND)+FDVth will not change.

Figure 26:
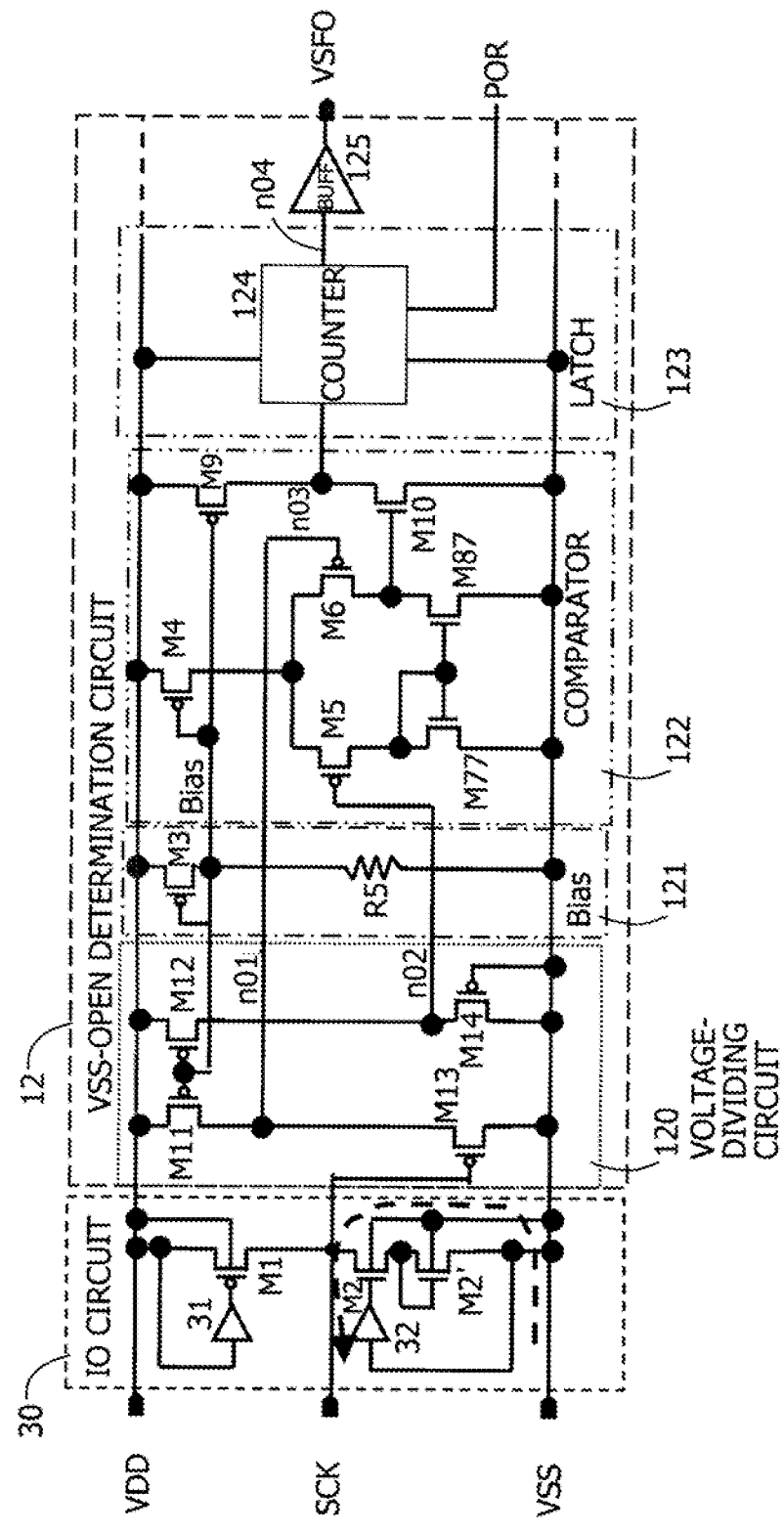
FIG. 26 is a circuit diagram of the integrated circuit according to the second embodiment.

FIG. 26 is a circuit diagram of the integrated circuit according to the second embodiment. It has the IO circuit 30 of FIG. 25, and the VSS open determination circuit 12 is the same as FIG. 22. In the case of the IO circuit 30 of the first example, since the transistors M2 and M2' were provided between the clock terminal SCK and the ground terminal VSS, when the ground terminal VSS becomes an open state, it becomes VSS=SCK(GND)+FDVth and rises considerably. Accordingly, it is possible to increase the voltage difference between the nodes n01, n02 in the state n01>n02 where the ground terminal VSS is normally connected and the state n01<n02 where the ground terminal VSS is open, and the operation margin can thereby be increased. Consequently, it is possible to inhibit the erroneous detection when the clock terminal SCK drops lower than the ground potential GND in a state where the ground terminal VSS is connected normally as depicted in FIG. 24.

Figure 27:
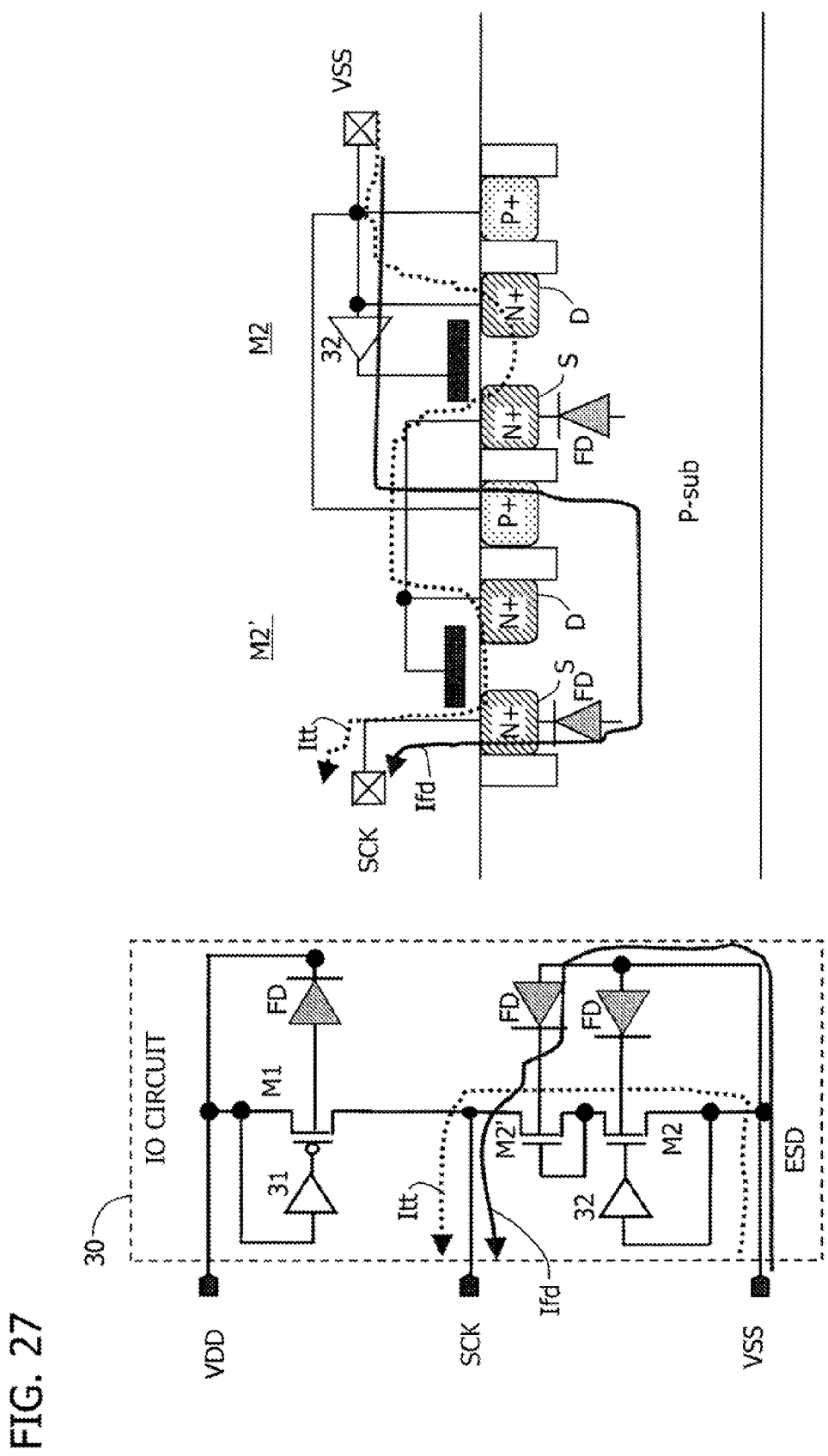
FIG. 27 is a diagram depicting the second example of the IO circuit of the integrated circuit according to the second embodiment and the cross section on its chip.

FIG. 27 is a diagram depicting the second example of the IO circuit of the integrated circuit according to the second embodiment and the cross section on its chip. With this IO circuit 30, N-channel MOS transistors M2 and M2' are connected in series to the unidirectional circuit between the clock terminal SCK and the ground terminal VSS. An output of the buffer 32 is connected to a gate of the transistor M2, and a gate of the added transistor M2' is connected to a source of the transistor M2. In addition, the transistors M1, M2' are both supplied with the back gate bias from the ground terminal VSS. In the foregoing case, the transistor M2' can be turned ON.

As depicted in the cross section diagram, as the current paths between the ground terminal VSS in an open state and the clock terminal SCK, there are a current path Itt that passes between the drain and source of both transistors M2, M2', and a current path Ifd that passes through the field diode FD of the transistor M2'. Since the voltage drop of the current path Ifd is FDVth and the voltage drop of the current path Itt is NMOSVth+FDVth, the current path Ifd becomes dominant. Consequently, the voltage of the ground terminal VSS in an open state becomes VSS=SCK(GND)+FDVth. In addition, this voltage VSS=SCK(GND)+FDVth will not change even if an additional transistor M2' is added.

As described above, even with the IO circuit 30 of the second example, as with the first example, when the ground terminal VSS becomes an open state, its potential becomes VSS=SCK(GND)+FDVth and rises considerably. Accordingly, it is possible to increase the voltage difference between the nodes n01, n02 in the state n01>n02 where the ground terminal VSS is normally connected and the state n01<n02 where the ground terminal VSS is open, and the operation margin can thereby be increased. Consequently, it is possible to inhibit the erroneous detection when the clock terminal SCK drops lower than the ground potential GND in a state where the ground terminal VSS is connected normally as depicted in FIG. 24.

Figure 28:
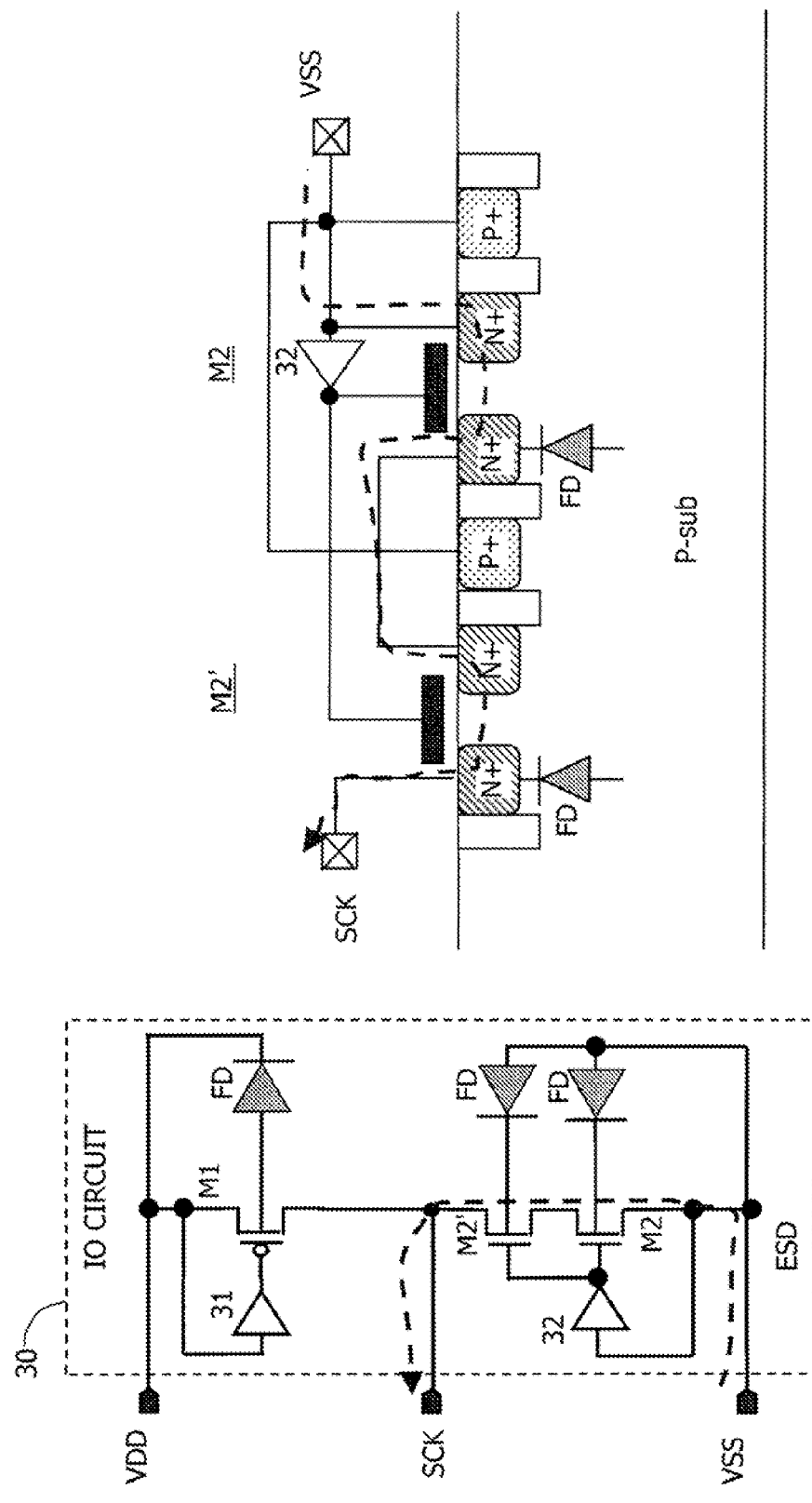
FIG. 28 is a diagram depicting the third example of the IO circuit of the integrated circuit according to the second embodiment and the cross section on its chip.

FIG. 28 is a diagram depicting the third example of the IO circuit of the integrated circuit according to the second embodiment and the cross section on its chip. With this IO circuit 30, N-channel MOS transistors M2 and M2' are connected in series to the unidirectional circuit between the clock terminal SCK and the ground terminal VSS. In addition, an output of the buffer 32 is connected to gates of the transistors M2, M2. Moreover, the transistors M1, M2' are both supplied with the back gate bias from the ground terminal VSS. In the foregoing case, the configuration is such that the gate length of the transistor M2 is substantially longer due to the transistor M2'.

Consequently, as the current path between the ground terminal VSS and the clock terminal SCK, the path between the drain and source of the transistors M2, M2' becomes dominant. Consequently, the voltage of the ground terminal VSS when the ground terminal VSS is in an open state will be VSS=SCK(GND)+NMOSVth (M2, M2'). This threshold NMOSVth becomes slightly greater in comparison to the case where only the transistor M2 exists. Thus, the operation margin between the nodes n01, n02 is increased, and the erroneous detection of the VSS open can be inhibited.

Figure 29:
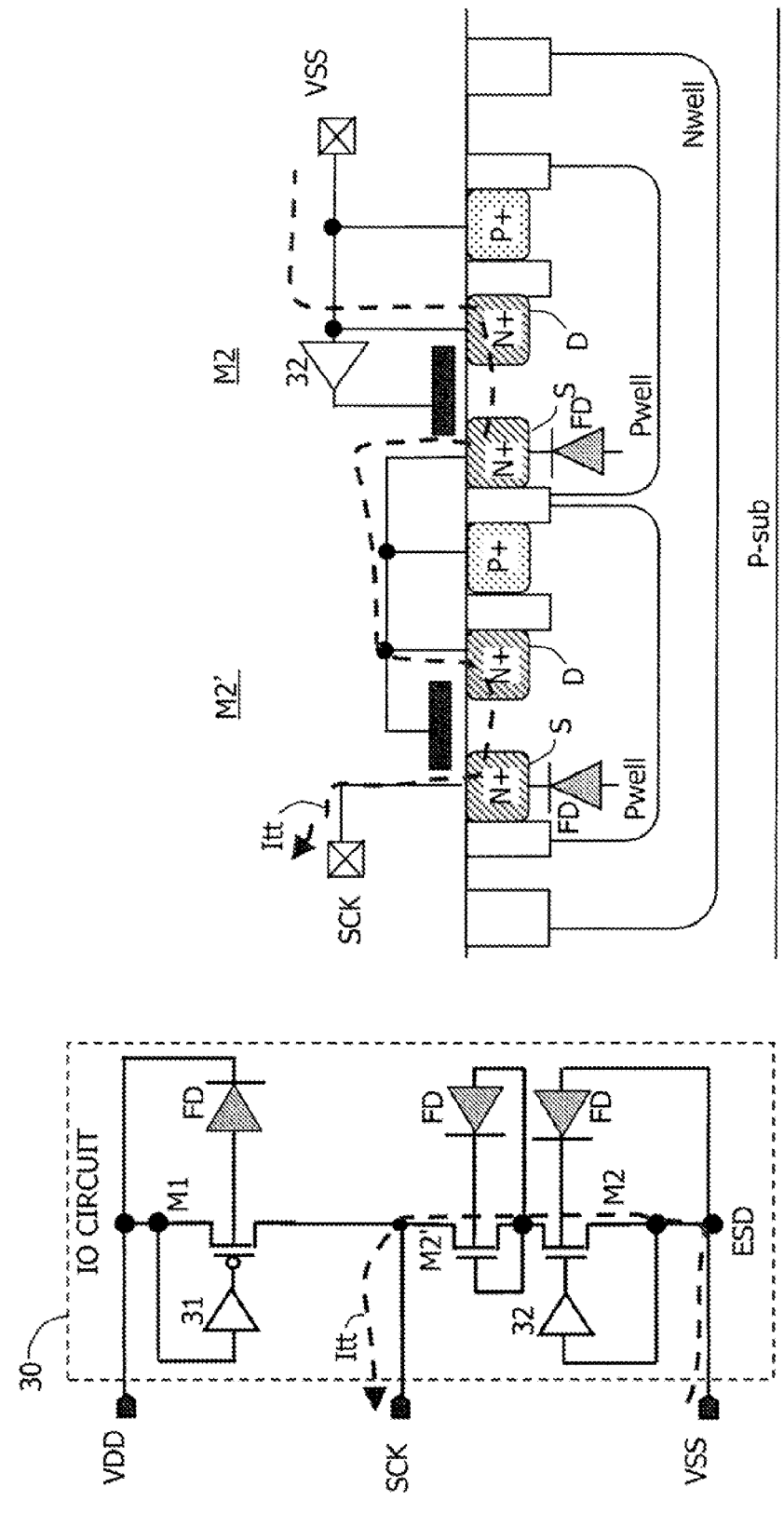
FIG. 29 is a diagram depicting the fourth example of the IO circuit of the integrated circuit according to the second embodiment and the cross section on its chip.

FIG. 29 is a diagram depicting the fourth example of the IO circuit of the integrated circuit according to the second embodiment and the cross section on its chip. With this fourth example, N-channel MOS transistors M2 and M2' are connected in series to the unidirectional circuit between the clock terminal SCK and the ground terminal VSS, the transistor M2' is provided between the transistor M2 and the clock terminal SCK, and its gate is connected to a source terminal S of the transistor M2. Moreover, the two transistors M2, M2' are respectively formed in separate P-type well regions Pwell. In addition, the transistor M2 is supplied with the back gate bias from the ground terminal VSS and the transistor M2' is supplied with the back gate bias from the source terminal S of the transistor M2.

With the IO circuit of the fourth example, when the ground terminal VSS becomes an open state, the current path Itt that passes between the drain and source of the transistors M2, M2' becomes dominant. In other words, since both transistors M2, M2' are respectively formed in separate P-type well regions Pwell, in the respective transistors, there are a current path that passes between the source and drain, and a current path that passes through the field diode FD of the PN junction between the source S and the P-type well region Pwell. However, since the voltage drop PMOSVth of the former is smaller than the voltage drop FDVth of the latter, the current path Itt between the source and drain becomes dominant in both transistors.

When the transistors M2, M2' are provided as with the IO circuit of the fourth example, the voltage of the VDD when the ground terminal VSS is in an open state will be as follows.

$$VSS=SCK(GND)+2\times NMOSVth$$

The potential of the ground terminal VSS is higher than the VSS=SCK(GND)+NMOSVth of the example depicted in FIG. 22. Thus, it is possible to inhibit the erroneous detection of the open state of the ground terminal VSS when the ground terminal VSS is connected normally.

Each time the second transistor M2' is increased in the IO circuit of the fourth example, the potential of the ground terminal VSS in an open state will rise by NMOSVth each time the transistor M1' is increased. Thus, the voltage of the ground terminal VSS in cases where the total number of first and second transistors M2, M2' is N will be as follows.

$$VSS=SCK(GND)+N\times NMOSVth$$

In other words, by further increasing the transistors M2', the voltage of the ground terminal VSS in a ground open state can also be increased further, and the voltage between the nodes n01, n02 can be widened.

Figure 30:
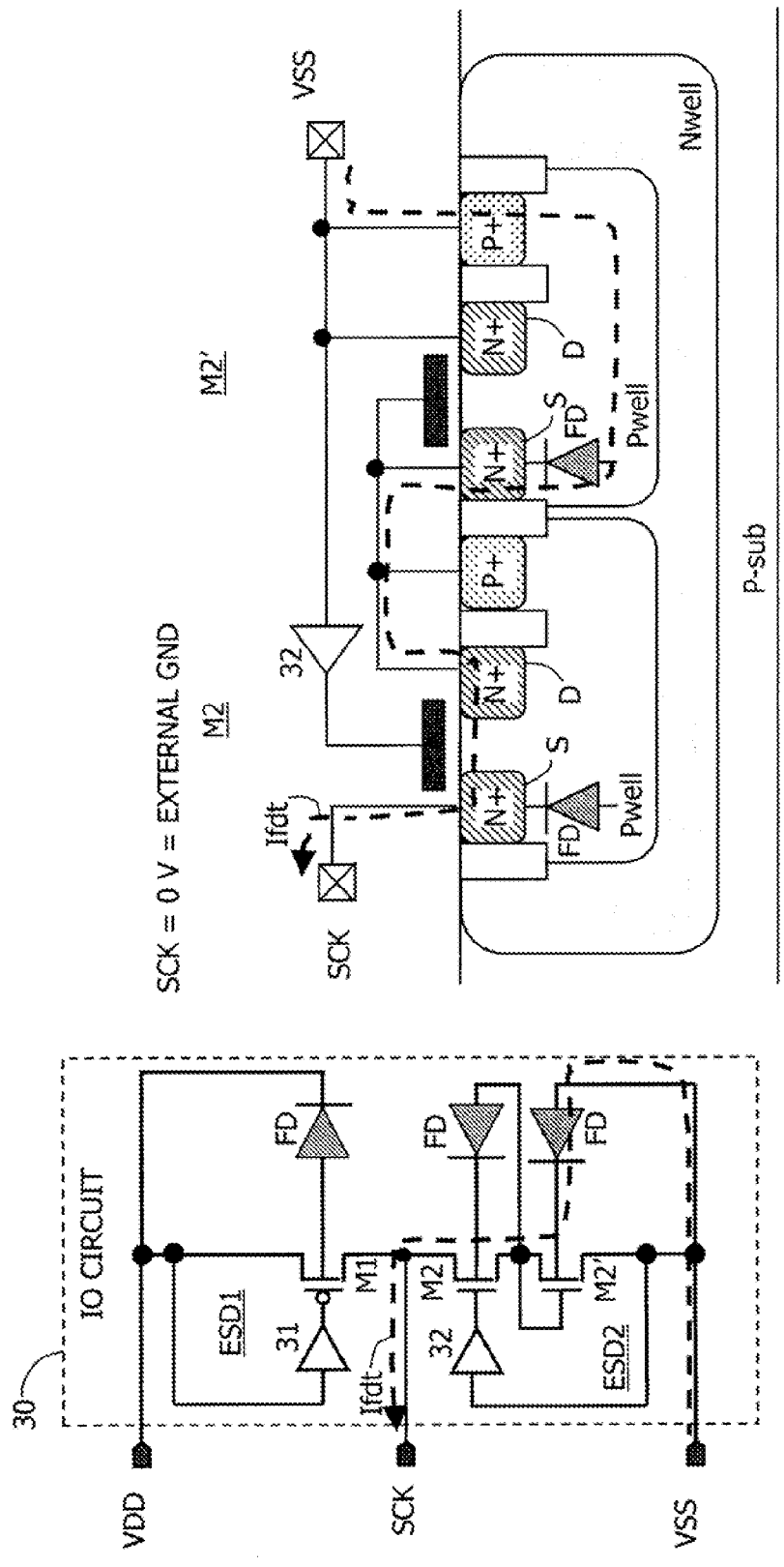
FIG. 30 is a diagram depicting the fifth example of the IO circuit of the integrated circuit according to the second embodiment and the cross section on its chip.

FIG. 30 is a diagram depicting the fifth example of the IO circuit of the integrated circuit according to the second embodiment and the cross section on its chip. With this fifth example, N-channel MOS transistors M2 and M2' are connected in series to the unidirectional circuit ESD2 between the clock terminal SCKT and the ground terminal VDD, and a buffer 32 is connected to a gate of the transistor M2. The transistor M2' is provided between the transistor M2 and the ground terminal VSS, and its gate is connected to a drain terminal D of the transistor M2. Moreover, the two transistors M2, M2' are respectively formed in separate P-type well regions Pwell. In addition, the transistor M2' is applied with the back gate bias from the ground terminal VSS, and the transistor M2 is applied with the back gate bias from the source terminal S of the transistor M2'. The second transistor M2' is in an OFF state since the gate and source are short circuited.

In this fifth example, when the ground terminal VSS becomes an open state and rises above the L-level (ground GND) of the clock terminal SCK as the input terminal, the current path between the source and drain becomes dominant in transistor M2, but only a current path that passes through the field diode FD is formed in the transistor M2'. Consequently, the current path Ifdt in FIG. 30 becomes dominant.

When the transistors M2, M2' are provided as in the fifth example, the voltage of the VSS when the ground terminal VSS is in an open state will be as follows.

$$VSS=SCK(GND)+NMOSVth+FDVth$$

The potential of the ground terminal VSS is higher than the VSS=SCK(GND)+NMOSVth of the example depicted in FIG. 22. Thus, it is possible to inhibit the erroneous detection of the open state of the ground terminal VSS when the ground terminal VSS is connected normally.

Each time the second transistor M2' is increased in the IO circuit of the fifth example, the voltage of the ground terminal VSS in a VSS open state will increase by FDVth each time the transistor M2' is increased. Thus, the voltage of the ground terminal VSS in cases where the total number of transistors M2' is N−1 will be as follows.

$$VSS=SCK(GND)+NMOSVth+(N-1)\times FDVth$$

Accordingly, by increasing the number of the transistors M2', the voltage of the ground terminal VSS in a ground open state can be increased.

As described above, with the integrated circuit according to the second embodiment, it is possible to increase the operation margin of the ground open determination circuit, and inhibit the erroneous detection of the ground open when the ground terminal VSS is connected normally.

Figure 31:
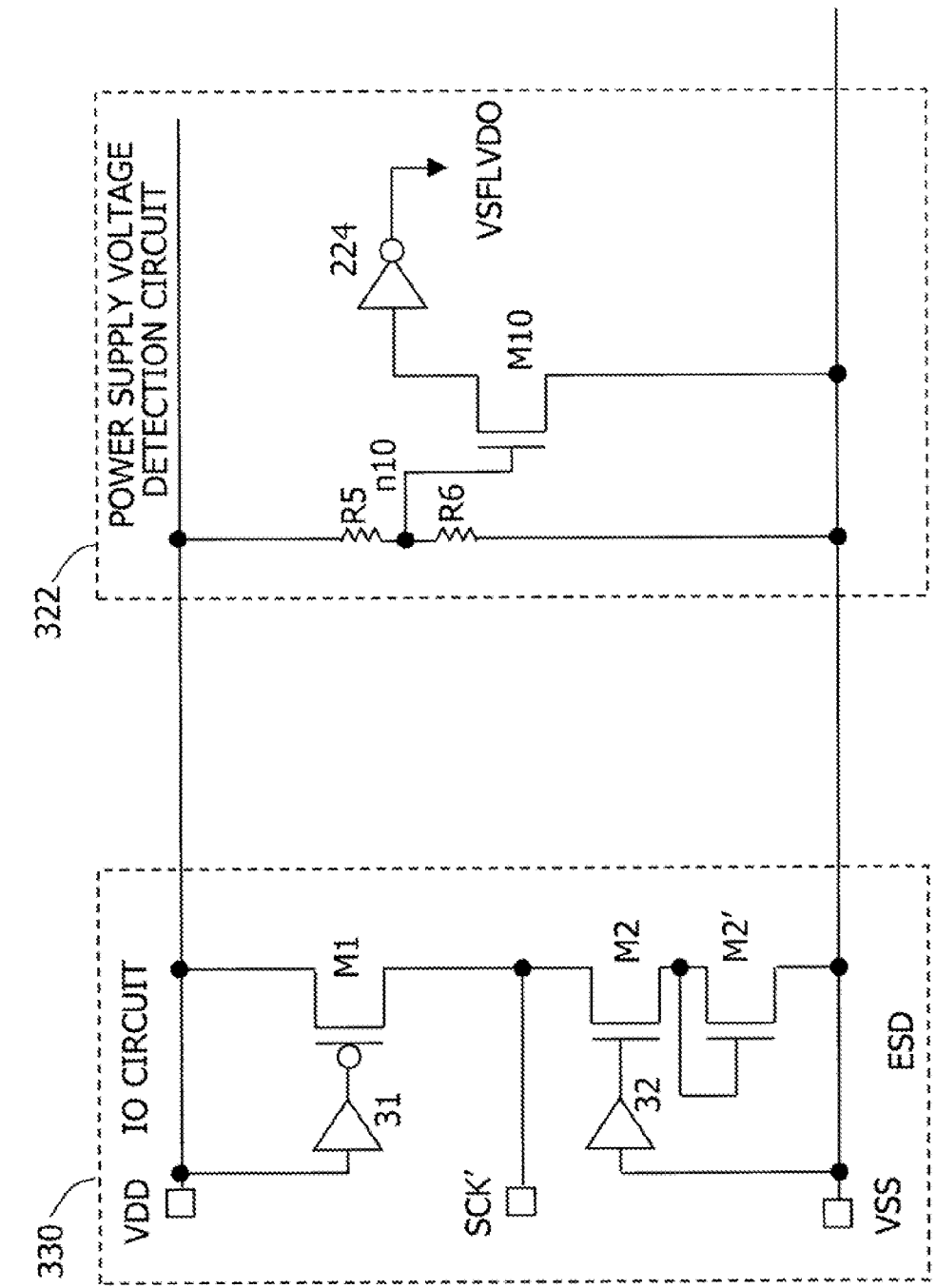
FIG. 31 is a diagram depicting a modified example of the ground open determination circuit according to the second embodiment.

FIG. 31 is a diagram depicting a modified example of the ground open determination circuit according to the second embodiment. In FIG. 31, the unidirectional circuit between the input terminal SCK' and the ground terminal VSS in the IO cell 30 is the same as the first example of FIGS. 25 and 26. In addition, the power supply voltage detection circuit 322 of FIG. 31 differs from the ground open determination circuit 12 of FIG. 22.

Specifically, the power supply voltage detection circuit 322 of FIG. 31 only detects whether the voltage (potential difference of VDD−VSS) of the power terminal VDD dropped lower than the reference voltage. It does not compare the voltage-dividing level of the voltage of the ground terminal VSS and the voltage-dividing level of the voltage of the input terminal SCK' as depicted in FIG. 22. Moreover, the SCK' signal to be input as the L-level when the ground is OPEN is not a clock signal which successively repeats the VDD level and the VSS level as in the second embodiment, but a signal of an external ground level is input to SCK' constantly.

The power supply voltage detection circuit 322 of FIG. 31 divides the power terminal VDD with the resistors R5, R6, and connects the divided node n10 to a gate of the N-channel transistor M10. Since the source of the transistor M10 n10 is connected to the ground terminal VSS, if the voltage-dividing level of the node n10 is higher than the threshold voltage NMOSVth of the transistor M10, it turns ON the transistor M10 and the detection signal VSFLVDO becomes an H-level, and, if it is lower, it turns OFF the transistor M10 and the detection signal VSFLVDO becomes al L-level.

Accordingly, even in cases where the power terminal VSS becomes an open state and the voltage of the power terminal VSS rises considerably due to the first and second transistors M2, M2' in the IO cell 30 described above, the ground open can be detected as a result of decreasing the potential difference of the VDD−VSS.

This power supply voltage detection circuit 322 detects whether the power supply voltage VDD dropped lower than an absolute value. In a ground open state, the VSS level rises and the potential difference of the VDD−VSS relatively decreases in comparison to a state during normal ground connection. In other words, it can be detected even in cases when the ground terminal VSS rises above the ground level for some reason. In other words, it concurrently functions as a circuit for detecting a voltage drop and a circuit for detecting the open state of the ground terminal VSS by reducing the potential difference of VDD−VSS. However, both states is better to cause the same level of detected voltage drop to the power supply voltage (VDD−VSS potential difference). Accordingly, the circuit configuration of the first and second transistors M2, M2 in the IO cell needs to be selected so that it matches the level of detecting the decrease in the potential difference between the power supply voltage VDD and the ground terminal VSS.

Moreover, since the power supply voltage detection circuit 332 is comparing the voltage drop of the power supply voltage VDD with an absolute value, if it free from false detections that occur when the input terminal SCK' undershoots or drops lower than the potential of the ground terminal VSS as explained with reference to FIG. 24.

Note that, in the power supply voltage detection circuit of FIG. 31, in substitute for the transistor M10, a comparator for comparing the voltage of the node n10 and an absolute reference voltage may be used. In the foregoing case also, the comparator detects a decrease in the potential difference between the power terminal VDD and VSS and generates a power state detection signal.

As described above, the second embodiment illustrated examples of five integrated circuits. As depicted in these examples, the unidirectional circuit provided between the input terminal SCK' and the ground terminal VSS is configured from a plurality of NMOS transistors. Accordingly, as described above, it is possible to raise the level of the ground terminal VSS when the power terminal ground becomes an open state. Consequently, it is possible to inhibit the erroneous detection of the VSS open state when the ground terminal VSS is connected normally.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiment(s) of the present invention, has (have) been described in detail, it should be understood that the various changes, substitutions, and alterations could be made hereto without departing from the spirit and scope of the invention.

What is claimed is:

1. An integrated circuit in which a power terminal, a ground terminal, an input terminal and an internal circuit are formed, comprising:
   a unidirectional circuit of a direction from the input terminal to the power terminal, the unidirectional circuit being provided between the input terminal and the power terminal, the unidirectional circuit including a first transistor and a second transistor, a voltage of the power terminal being applied to a gate of the first transistor, the first transistor and the second transistor being connected in series between the input terminal and the power terminal; and
   a power state determination circuit which detects whether the power terminal is connected to an external power source or not to output a power open detection signal,
   wherein a voltage of the external power source is input to the input terminal.

2. The integrated circuit according to claim 1,
wherein the power state determination circuit includes:
   a first voltage-dividing circuit which divides a voltage between the input terminal and the ground terminal to generate a first voltage-dividing signal;
   a second voltage-dividing circuit which divides a voltage between the power terminal and the ground terminal to generate a second voltage-dividing signal; and
   a comparator which compares the first and second voltage-dividing signals to output the power open detection signal.

3. The integrated circuit according to claim 1,
wherein the power state determination circuit operates as a power supply voltage detection circuit having a function of detecting a voltage of the power terminal, and detects whether the voltage of the power terminal is lower than a reference voltage and outputs the power open detection signal.

4. The integrated circuit according to claim 1,
wherein the first and second transistors are P-channel MOS transistors, and
wherein the second transistor is provided between the first transistor and the power terminal, and a gate is connected to a drain terminal of the first transistor.

5. The integrated circuit according to claim 1,
wherein the first and second transistors are P-channel MOS transistors, and
wherein the second transistor is provided between the first transistor and the input terminal, and a gate is connected to a source terminal of the first transistor.

6. The integrated circuit according to claim 1,
wherein the first and second transistors are P-channel MOS transistors, and
wherein the second transistor is provided between the first transistor and the input terminal, and a gate is connected to a gate of the first transistor.

7. The integrated circuit according to claim 1,
wherein the first and second transistors are P-channel MOS transistors provided to different N-type well regions respectively, and
wherein the second transistor is provided between the first transistor and the input terminal, and a gate is connected to a source terminal of the first transistor.

8. The integrated circuit according to claim 1,
wherein the first and second transistors are P-channel MOS transistors provided to different N-type well regions respectively, and
wherein the second transistor is provided between the first transistor and the power terminal, and a gate is connected to a drain terminal of the first transistor.

9. An integrated circuit in which a power terminal, a ground terminal, an input terminal and an internal circuit are formed, comprising:
   a unidirectional circuit of a direction from the ground terminal to the input terminal, the unidirectional circuit being provided between the input terminal and the ground terminal, the unidirectional circuit including a first transistor and a second transistor, a voltage of the ground terminal being applied to a gate of the first transistor, the first transistor and the second transistor being connected in series between the input terminal and the ground terminal; and
   a power state determination circuit which detects whether the ground terminal is connected to an external ground terminal or not to output a ground open detection signal,
   wherein a voltage of the external ground terminal is input to the input terminal.

10. The integrated circuit according to claim 9,
wherein the power state determination circuit includes:
   a third transistor in which the input terminal is connected to a gate and in which a source and a drain are connected between the power terminal and the ground terminal;
   a fourth transistor in which the ground terminal is connected to a gate and in which a source and a drain are connected between the power terminal and the ground terminal; and
   a comparator which compares potentials of nodes between the drains of the third and fourth transistors and the power terminal, and outputs a ground open detection signal informing that the ground terminal of the chip is of an open state of not being connected to the external ground terminal.

11. The integrated circuit according to claim 9,
wherein the power state determination circuit operates as a power supply voltage detection circuit having a function of detecting a power supply voltage of the power terminal, and detects that the ground terminal is open based on whether the voltage of the power terminal is lower than a reference voltage.

12. The integrated circuit according to claim 9,
wherein the first and second transistors are N-channel MOS transistors, and
wherein the second transistor is provided between the first transistor and the ground terminal, and a gate is connected to a drain terminal of the first transistor.

13. The integrated circuit according to claim 9,
wherein the first and second transistors are N-channel MOS transistors, and
wherein the second transistor is provided between the first transistor and the input terminal, and a gate is connected to a source terminal of the first transistor.

14. The integrated circuit according to claim 9,
wherein the first and second transistors are N-channel MOS transistors, and
wherein the second transistor is provided between the first transistor and the input terminal, and a gate is connected to a gate of the first transistor.

15. The integrated circuit according to claim 9,
wherein the first and second transistors are N-channel MOS transistors provided in different P-type well regions, and
wherein the second transistor is provided between the first transistor and the input terminal, and a gate is connected to a source terminal of the first transistor.

16. The integrated circuit according to claim 9,
wherein the first and second transistors are N-channel MOS transistors provided in different P-type well regions, and
wherein the second transistor is provided between the first transistor and the ground terminal, and a gate is connected to a drain terminal of the first transistor.

* * * * *